(12) United States Patent
Anders et al.

(10) Patent No.: US 11,009,579 B2
(45) Date of Patent: May 18, 2021

(54) DEVICE AND METHOD FOR GENERATING AND DETECTING A TRANSIENT MAGNETIZATION OF A SAMPLE

(71) Applicant: Helmholtz-Zentrum Berlin fuer Materialien und Energie GmbH, Berlin (DE)

(72) Inventors: Jens Anders, Stuttgart (DE); Klaus Lips, Berlin (DE)

(73) Assignee: HELMHOLTZ-ZENTRUM BERLIN EUER MATERIALIEN UND ENERGIE GMBH, Berlin (DE)

( * ) Notice: Subject to any disclaimer, the term of this patent is extended or adjusted under 35 U.S.C. 154(b) by 434 days.

(21) Appl. No.: 15/779,104

(22) PCT Filed: Nov. 21, 2016

(86) PCT No.: PCT/DE2016/100540
§ 371 (c)(1),
(2) Date: Oct. 25, 2018

(87) PCT Pub. No.: WO2017/088852
PCT Pub. Date: Jun. 1, 2017

(65) Prior Publication Data
US 2019/0049543 A1    Feb. 14, 2019

(30) Foreign Application Priority Data

Nov. 27, 2015   (DE) .................... 10 2015 120 644.7

(51) Int. Cl.
*G01R 33/60* (2006.01)
*G01R 33/30* (2006.01)
(Continued)

(52) U.S. Cl.
CPC ........... *G01R 33/60* (2013.01); *G01R 33/302* (2013.01); *G01R 33/34092* (2013.01); *G01R 33/3607* (2013.01); *G01R 33/3621* (2013.01)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS 5,424,644 A   6/1995 Zeiger
5,512,829 A   4/1996 Holczer et al.
(Continued)

FOREIGN PATENT DOCUMENTS

| DE | 4223909 C2 | 2/1994 |
| DE | 4412064 A1 | 10/1995 |
| WO | WO 2005073695 A1 | 8/2005 |

OTHER PUBLICATIONS

Thomas Prisner, et al., "Pulsed EPR Spectroscopy: Biological Applications", Annu. Rev. Phys. Chem 2001, vol. 52, Dec. 2001, pp. 279-313.
(Continued)

*Primary Examiner* — Patrick Assouad
*Assistant Examiner* — Taqi R Nasir
(74) *Attorney, Agent, or Firm* — Leydig, Voit & Mayer, Ltd.

(57) ABSTRACT

A device for generating and detecting a transient magnetization of a includes a static magnetic field generator configured to generate a static magnetic field of predetermined direction and strength at a sample location, a transmission device for providing a transient magnetic field at the sample location; and a receiving device for detecting a transient magnetization of the sample at the sample location. An LC oscillator forms both the transmission device and the receiv-
(Continued)

ing device. An oscillation frequency of the LC oscillator depends on a value of an inductive element of the LC oscillator. A controller configured to control the LC oscillator is connected, and a transient magnetic field can be generated by the LC oscillator and the controller that is capable of deflecting a magnetization of a sample out of equilibrium.

14 Claims, 13 Drawing Sheets

(51) Int. Cl.
 *G01R 33/34* (2006.01)
 *G01R 33/36* (2006.01)
(58) Field of Classification Search
 CPC ...... G01R 33/307; G01R 33/24; G01R 33/54; G01R 33/30; G01R 33/34; G01R 33/60; G01V 3/32; E21B 49/08; E21B 2049/085; G01N 24/10
 See application file for complete search history.

(56) References Cited

U.S. PATENT DOCUMENTS

| | | | |
|---|---|---|---|
| 2007/0109061 A1* | 5/2007 | Rohde | H03B 5/1847 331/107 DP |
| 2009/0072920 A1* | 3/2009 | Wachi | H03B 5/1212 331/117 R |
| 2013/0328562 A1* | 12/2013 | Grenier | G01R 33/4831 324/309 |
| 2014/0091802 A1* | 4/2014 | Yang | G01R 33/60 324/322 |
| 2014/0097842 A1 | 4/2014 | Yang et al. | |
| 2014/0210473 A1 | 7/2014 | Campbell et al. | |

OTHER PUBLICATIONS

Reinhard Benn, et al., "Modern Pulse Methods in High-Resolution NMR Spectroscopy", Angew. Chem. Int. Ed. Engl. vol. 22, 1983, Dec. 1983, pp. 350-380.

T. Yalcin, et al., "Single-chip detector for electron spin resonance spectroscopy", Review of Scientific Insturments, vol. 79, Dec. 2008, 094105-1-094105-6.

N. Bloembergen, et al., "Radiation Damping in Magnetic Resonance Experiments", Physical Review, vol. 95, No. 1, Jul. 1, 1954, pp. 8-12.

Peter Kinget, "Amplitude detection inside CMOS LC oscillators", ISCAS 2006, Dec. 2006, pp. 5147-5150.

Jens Anders, et al., "K-band single-chip electron spin resonance detector", Journal of Magnetic Resonance 217 (2012), Dec. 2012, pp. 19-26.

* cited by examiner

DEVICE AND METHOD FOR GENERATING AND DETECTING A TRANSIENT MAGNETIZATION OF A SAMPLE

CROSS REFERENCE TO RELATED APPLICATIONS

This application is a U.S. National Stage Application under 35 U.S.C. § 371 of International Application No. PCT/DE2016/100540 filed on Nov. 21, 2016, and claims benefit to German Patent Application No. DE 10 2015 120 644.7 filed on Nov. 27, 2015. The International Application was published in German on Jun. 1, 2017, as WO 2017/088852 A1 under PCT Article 21(2).

FIELD

The invention relates to a device and a method for generating and detecting a transient magnetization of a sample, such as is used, for example, in electron spin resonance spectroscopy and nuclear magnetic resonance spectroscopy, which are used, inter alia, in experimental physics, medical technology, materials sciences or earth sciences.

BACKGROUND

In electron spin resonance spectroscopy (ESR, also termed EPR, electron paramagnetic resonance) and nuclear magnetic resonance spectroscopy (NMR), samples are exposed in a statically homogeneous, statically inhomogeneous or dynamic (pulsed inhomogeneous) magnetic field, normally termed $B_0$, to additional high-frequency alternating electromagnetic fields (in ESR mostly in the microwave range between 1 and 263 GHz), usually described as $B_1$.

By coupling alternating fields ($B_1$) of a suitable frequency and polarization, transitions are induced between the energy levels of discrete spin states of the nucleus configuration and/or electron configuration of a sample, which lead for their part to absorption processes in the alternating field, which processes can be detected. Different analytical information of the sample can be determined from the detected absorption processes. The linearly polarized field $B_1$ is usually oriented perpendicular to $B_0$ in this case.

Samples which are accessible to characterization by ESR or NMR experiments are accordingly all magnetizable samples, i.e. paramagnetic samples (unpaired electrons, ESR) or samples comprising atomic nuclei having "net nuclear spin" due to an odd number of nucleons (NMR). The samples can be liquid, solid or also gaseous. In the following, the term "sample" is always used in the sense of a magnetizable sample, as introduced here.

For the unambiguous characterization of the energy differences of the spin states (resonance energy) and the associated spectral lines, the spectral components, the gyromagnetic ratio γ or the so-called g factor, also termed the Landé factor, can optionally be used according to:

$$\Delta E = h \cdot \omega = \gamma \cdot B_0 \cdot h = g \cdot \mu_B \cdot B_0$$

(h=Planck's constant, $\mu_B$=Bohr magneton, ω=angular frequency of the precession of the magnetic field). The g factors in this case are not necessarily isotropic and must be treated as tensors if applicable. The spectral components here depend not only on the g factors, but e.g. also on the coupling with adjacent nuclear spins and electron spins. In this case, e.g. due to microscopic magnetic interactions inside the sample, the energy difference of spin states can be modified further, which can then be described by the so-called total Hamiltonian interaction operator. This complex connection is simply described below by the resonance of the spin states to be observed and the respective interactions are not further explained. In the case of resonance, the frequency corresponds to the so-called Larmor frequency.

In the resonance of the excitation by the $B_1$ field, so-called Rabi oscillations occur. These are oscillations in a quantum-mechanical two- or multilevel system, which interacts with an external periodic force (e.g. an oscillating magnetic field). If the excitation frequency lies close to the resonance frequency of the transitions, the occupation of the states oscillates at a frequency that is also described as a Rabi frequency.

ESR and NMR experiments are usually conducted at the resonance frequency or as close to it as possible, as is presupposed below unless otherwise noted.

In the so-called continuous wave ESR or NMR experiments, upon continuous irradiation by alternating magnetic fields ($B_1$) and any simultaneous change in the strength of the magnetic field ($B_0$), the energy that corresponds to permitted or weakly prohibited transitions between various energy levels of spin ensembles (resonance) is determined.

In so-called pulsed ESR or NMR experiments, a strong electromagnetic pulse ($B_1$) (transient magnetic field) is used to excite a precession motion of the orientation of the macroscopic magnetization of the sample around the direction of the effective magnetic field in the sample and its relaxation process as well as the precession frequency are detected, with a static or also dynamic (temporally and/or locally variable) magnetic field $B_0$. The relaxation process is also described as transient (temporally variable) magnetization and a so-called transient signal is detected. The transient magnetization is limited in its time duration by the spin-lattice relaxation time ($T_1$) and the spin-spin relaxation time ($T_2$). For ESR experiments, these times are in the sub-nano to second range, but the usual measuring windows lie between 1 ns and 1 ms.

To avoid relaxation processes during the excitation, which considerably simplifies the modelling of the experiment, the period of time in which the transient magnetic field ($B_1$(t ω,)) is applied must be short compared with the relaxation times. Since relaxation times of a sample in the case of ESR can lie in the sub-nanosecond range, transient magnetic fields having durations in the sub-nanosecond range (<1 ns) are required for certain samples. The duration of the transient magnetization depends on the sample in this case via the connection with the spin-lattice relaxation time ($T_1$) and spin-spin relaxation time ($T_2$).

The magnetic field $B_0$ in pulsed ESR or NMR experiments can be a magnetic field that is linearly variable over the location (gradient field), such as is used e.g. in imaging methods based on magnetic resonance.

The physical principles are elaborated in greater detail below. In classic mechanics a magnetic dipole moment $\vec{\mu}$ in a magnetic field $\vec{B}$ experiences a torque $\vec{\tau}$ according to $\vec{\tau} = \vec{\mu} \times \vec{B}$. In principle, any macroscopic magnetization $\vec{M}$ can accordingly be influenced in the form of an applied, external magnetic field, because it results from a combined effect of microscopic magnetic moments. ESR or NMR experiments are known examples of this, in which an external magnetic field is applied and a sample magnetization $\vec{M}_s$, which is linked to the spins of electrons or atomic nuclei and their interaction, is determined. Quantum-mechanical observations show that the spin of a particle is not only linked to the magnetic dipole moment $\vec{\mu}$, but also to the orbital angular momentum $\vec{L}$, which are related to one another according to $\vec{\mu} = \gamma \cdot \vec{L}$, by the gyromagnetic ratio $\gamma$, which is specific to a material of a sample. In the simplest case to be considered of spin ½ particle and the assumption that no interaction is present between the spins, the macroscopic magnetization based on the spins can be described within an applied magnetic field $\vec{B}$ by a simplified Bloch equation, i.e. a Bloch function without relaxation terms according to $$\frac{d\vec{M}_s}{dt} = -\gamma \cdot (\vec{M}_s \times \vec{B}). \quad (0.1)$$

It follows from (0.1) that a spin-based magnetization $M_s$, which encloses an angle with a magnetic field $B_0$, executes a precession motion about the axis of the $B_0$ field at an angular velocity that corresponds to the so-called Larmor frequency $\omega_L = -\gamma \cdot B_0$. A deflection of the magnetization $M_s$ can take place e.g. due to an applied, temporally variable magnetic field $B_1$, which is oriented perpendicular to $B_0$ and has a frequency $\omega_L$, so that $M_s$ rotates about the axis of the $B_1$ field. Since this case, in which $\vec{M}_s$ is not oriented parallel to $\vec{B}_0$, corresponds to a state of inequilibrium, relaxation mechanisms cause any transverse magnetization $M_{s,\perp}$ to decay to zero and the longitudinal magnetization $M_{s\|}$ in the direction of $B_0$ is restored, which corresponds to the state of equilibrium $M_{s0}$. This circumstance can be taken into account with the introduction of the relaxation times into the Bloch equation according to (0.1) by $$\frac{d\vec{M}_s}{dt} = -\gamma \cdot (\vec{M}_s \times \vec{B}) + \frac{1}{T_2} \cdot \vec{M}_{s\perp} + \frac{M_{s\|} - M_{s0}}{T_1} \vec{e}_\| \quad (0.2)$$

($t$ = time, $\vec{e}_\|$ = unit vector in the direction of the $B_0$ field).

Article 1 by M. Prisner et al. (Pulsed EPR Spectroscopy: Biological Applications, Annual Review of Physical Chemistry 52, 2001, P. 279-313) provides a summary of pulsed ESR experiments on biological samples and Article 2 by R. Benn and H. Günther (Modern Pulse Methods in High-Resolution NMR Spectroscopy, Angewandte Chemie (Applied Chemistry) International Edition, Vol. 22, 1983, P. 350-380) a summary of pulsed NMR experiments.

In DE 42 23 909 C2, a device for measuring magnetic resonance for use in medical technology is disclosed, in which a solenoid coil is used to generate the magnetic field $B_0$. An arrangement used as a transmission or receiving device consists of a split ring resonator. Furthermore, a coupling device is provided for detecting a resonance signal, realized by a coupling loop. Further circuit units complete the device.

A device described as an electron spin resonance pulse spectrometer is disclosed in DE 44 12 064 A1. It has a first microwave oscillator for generating scanning signals (measuring signals), $B_1$, and a second microwave oscillator for generating auxiliary signals of a lower microwave frequency. In addition, a first mixer and a pulse-shaping channel for generating mixed signals of a pulse length suitable for electron spin resonance pulse experiments and a resonator for detection are provided.

In US 2014/0210473 A1, an electron spin resonance spectrometer is disclosed that is equipped with a probe tip as the transmission and receiving device. The excitation field ($B_1$) for the transmission device is generated outside of this and is conducted by suitable means into the probe tip. The spectrometer can also be operated in pulsed mode, the pulses and the detection of the signals being of a time duration, however, that does not enable any time-resolved detection of a transient magnetization of a sample.

One challenge for ESR or NMR experiments is the realization as so-called "single-chip" (single-chip processor) designs having integrated circuit technology, which make the application of the experiments user-friendly, miniaturized and cheap compared with conventional designs.

In Article 3 by T. Yalcin and G. Boero (Single-chip detector for electron spin resonance spectroscopy, Review of Scientific Instruments 79, 2008, P. 094105-1-6) a "single-chip" ESR spectrometer is disclosed that operates in continuous wave mode. The substantial components of the detector, which is implemented in so-called CMOS (complementary metal-oxide-semiconductor) technology, are two voltage-controlled LC oscillators, also termed voltage-controlled oscillators (VCO), a mixer, a filter amplifier, two frequency dividers and signal conditioners and a phase-locked loop as detectors. Means must additionally be provided for generating the magnetic field $B_0$ and for wiring the spectrometer.

A device arranged on a chip, which is disclosed in WO 2005/073695 A1, comprises means for generating a magnetic field in a predetermined direction, a transmission device, which comprises a conductor path among other things and a receiving device, which contains a sensor detecting the magnetic resistance.

In US 2014/0091802 A1, a single-chip ESR spectrometer is disclosed, which is operated in a pulsed manner and in continuous wave mode and can be implemented, inter alia, in CMOS technology. It has a means for generating a magnetic field in a predetermined direction, also a transmission device, which consists of an LC-VCO and an amplifier, to which a pulse generator is coupled and which feeds a resonator. The same or another resonator is connected here as a receiving device. The receiving device further consists of an amplifier, a mixer and a baseband amplifier.

US 2014/0097842 A1 discloses a method for determining the magnetic resonance or transient magnetization of a sample, which is carried out using the device from US 2014/0091802 A1. It includes the steps of: generating an oscillating scanning signal by means of the integrated oscillator circuit arrangement, amplifying the oscillating scanning signal by means of the integrated amplifier, receiving an ESR signal of a sample by means of the integrated receiver-amplifier circuit, amplifying an ESR signal of a sample by means of the integrated receiver-amplifier circuit, down-converting the amplified ESR signal by means of the integrated mixer circuit to obtain a baseband signal, and amplifying the baseband signal by means of the integrated baseband amplifier circuit, wherein all switch units are integrated on one chip.

SUMMARY

In an embodiment, the present invention provides a device for generating and detecting a transient magnetization of a sample. The device includes a static magnetic field generator configured to generate a static magnetic field of predetermined direction and strength at a sample location, a transmission device for providing a transient magnetic field at the sample location; and a receiving device for detecting a transient magnetization of the sample at the sample location. An LC oscillator forms both the transmission device and the receiving device. An oscillation frequency of the LC oscillator depends on a value of an inductive element of the LC oscillator. A controller configured to control the LC oscillator is connected, and a transient magnetic field can be generated by the LC oscillator and the controller that is capable of deflecting a magnetization of a sample out of equilibrium. The period of the transient magnetic field can be restricted to the sub-nanosecond range and the sample location lies in the near field of the LC oscillator. At least one modulator, analog-to-digital converters, and digital data processors are connected downstream of the LC oscillator for processing an output voltage. A spectral component determiner configured to determine spectral components of the magnetization of the sample based on a physical model of transient inductance and transient resistance of a coil by at least the frequency or amplitude of the output voltage of the LC oscillator is provided in the digital data processor. An output configured to output the spectral components is further provided.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
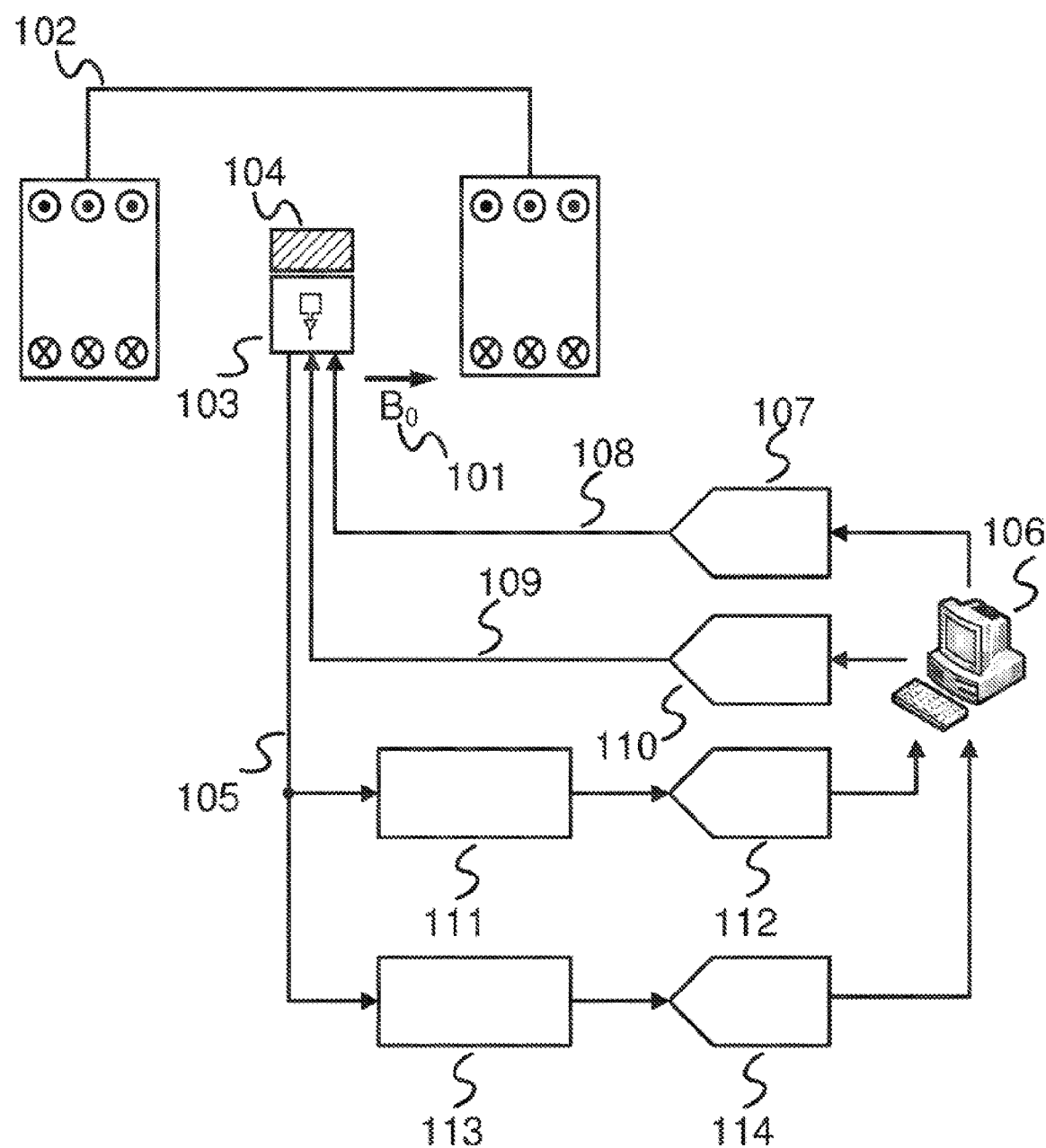
FIG. 1 is a schematic representation of a device for generating and detecting a transient magnetization.

A disadvantage of the resonator-based ESR and NMR spectrometers known from the prior art is that in these, to protect a low-noise preamplifier, the latter must be uncoupled from the resonator (blanked) during the pulse (the transient magnetic field), e.g. via a time-limited protective pulse, so that a detection of the magnetization is only possible following the (protective) pulse. This is based on the fact that the conversion in the resonator of electromagnetic energy into B fields requires high electrical outputs (>100 W or less in the case of microresonators), which are sent into the resonator. This large electrical output would saturate or even destroy the preamplifier or the readout electronics if not uncoupled.

Embodiments of the present invention provide devices and methods for generating and detecting a transient magnetization of a sample, by way of which transient magnetizations can be detected in a time-resolved manner. Devices according to embodiments of the invention can be constructed in a simplified manner as compared to devices of the prior art, can operate energy-efficiently, and can enable detection of the transient magnetization during the transient excitation.

Means for generating a magnetic field in a predetermined direction in the device according to embodiments of the invention can be realized, for example, by superconducting magnets or electromagnets of any design or permanent magnets. The magnetic field generated is static and corresponds to the magnetic field $B_0$, which is used to magnetize a sample suitable for magnetization. The magnetic field can be of any strength here, as long as the frequency of the excitation $B_1$ magnetic field is selected according to the resonance conditions.

Solid, gaseous and liquid samples can be considered as samples. Liquid samples can be placed e.g. in glass capillaries on planar implementations (e.g. in CMOS technology). At lower frequencies of $B_1$ as far as the so-called X band (approx. 10 GHz), the coils of the LC oscillators can also be realized as volume coils, into which the capillaries with liquid samples can be introduced or can be combined with (micro-) fluidic systems for transporting samples into the detector.

The sample location is a location in the device at which the sample is arranged and at which both the magnetic field ($B_0$) and, if applicable, the transient magnetic field ($B_1$) are applied. Means can be provided here for attaching and storing the sample.

The transmission device, which is used at the same time as a receiving device, consists of an LC oscillator, the oscillation frequency of which depends on the value of an inductive element of the LC oscillator. These can be e.g. Hartley, Colpitts or Armstrong oscillators or LC tank oscillators. These LC oscillators can be both implemented as LC oscillators with a fixed working frequency and designed for an entire frequency band by the use of (electrically or mechanically) tunable inductors and/or capacitors.

The individual circuit elements of the LC oscillators can be designed here as an integrated circuit or miniaturized (e.g. in CMOS technology), these implementations not being a prerequisite for the function of the device.

The LC oscillator serves here as a transmission device insofar as it generates the additional, transient magnetic field, which is oriented perpendicular to $B_0$. However, the arrangement of the LC oscillator is selected so that the sample or the sample location is situated in the near field of the LC oscillator.

The near field should be understood here for devices according to embodiments of the invention and for methods according to embodiments of the invention as the field of the LC oscillator in which the rotation of the $B_1$ field and, on account of div B=0, also the total $B_1$ field is essentially determined via the current density J in the inductive element by rot $\vec{B} \approx \mu_0 \cdot \vec{J}$ ($\mu_0$=magnetic field constant). In contrast to this, a wave propagation takes place in the far field and the $B_1$ and $E_1$ field (electric field) are generated reciprocally by rot $\vec{B}_1 \approx \mu_0 \cdot \epsilon_0 \partial \vec{E}_1/\partial t$, $\epsilon_0$=electric field constant, t=time. For the near field, it therefore applies that the $B_1$ field can be generated largely independently of the $E_1$ field, as no wave is yet present in the region of the near field. Due to this circumstance, the $E_1$ field can be optimized in a simplified manner or can be kept small. Small Et fields minimize electrical losses in the sample and the loss arising due to heating of the sample, which is an advantage of the device according to embodiments of the invention.

A transient magnetic field $B_1(t,\omega)$ (i.e. a magnetic field having a time-limited changed frequency) in the LC oscillator can be generated by suitable injection of voltages into voltage-controlled capacitors (varactors). The form of the change is not restricted here and can be formed e.g. in a stepped or sawtooth-shaped manner or as a peak.

The transient magnetic field $B_1(t,\omega)$, as a function of time and frequency, can be shortened to a period of time that is so much shorter than the relaxation times of the sample that relaxation effects during the pulse are negligible. Since relaxation times of a sample in the case of ESR can lie in the sub-nanosecond range, transient magnetic fields having durations in the sub-nanosecond range (<1 ns) are necessary for certain samples.

Moreover, according to embodiments of the invention, the possibility advantageously exists for detecting a transient magnetization of a sample during the application of the transient magnetic field, since, unlike in the case of the resonator-based ESR detectors known from the prior art, the detection electronics do not have to be protected from the strong electromagnetic excitation pulses. This is based on the fact that, when using an LC oscillator as a transmission and receiving device, the $B_1$ field for exciting the magnetization in the sample is generated in the oscillator itself by the current in the coil. In this case, on account of the very good conversion of current into a $B_1$ field (Biot-Savart Law, near field) the currents occurring in operation (depending on the size of the coil these are in the one-digit to three-digit mA range, in particular between 10 mA and 200 mA) are sufficient for $B_1$ fields that are greater than 1 mT, which in turn facilitate the short pulses required (10 mT corresponds approximately to a pulse length of 1 ns). The oscillator is not damaged or irreversibly changed here in operation to generate normal field strengths. The time resolution and the sensitivity of the measurements are improved. This is achieved principally by the fact that the measurement can begin sooner (still during the excitation/the pulse) and thus before the onset of significant relaxation effects.

The duration, number and form of the transient magnetic fields are selected according to the requirements of the sample and the desired manipulation of the spin ensemble in the sample.

In the simplest case, the pulse length should be selected depending on the sample so that the magnetization in the sample is tilted by $\theta=90°$ ($\theta=\gamma \cdot B_1 \cdot \tau_{puls}$, $\tau_{puls}$ duration of application of the resonant $B_1$ field, $\gamma$=gyromagnetic ratio), as the transverse magnetization is maximized thus. This is also detected by the LC oscillator according to embodiments of the invention. In general, however, any other angle of rotation can be set or used if this is advantageous for the relevant selected experiment.

The strength of the $B_1$ field can be made sufficiently great by means of devices according to embodiments of the invention in order to generate e.g. 90° pulse lengths ($\theta=$) 90° with $\tau_{puls}$ in the sub-nanosecond range, so that hereby in combination with the possibility of detection during the excitation, even so-called Rabi oscillations for samples having short $T_2$ relaxation times can be measured directly. The strength of the $B_1$ field is set here by a suitable choice of the oscillator supply voltage or the oscillator quiescent current and by choosing a suitable coil inductance in relation to the frequency-determined capacitance.

The voltages input at the voltage-controlled inductor or capacitor are present in the form of time-dependent waveforms. The time-dependent waveforms are characterized in that they contain a change in the voltage strength of limited duration. The changes in the voltage cause the transient magnetic field $B_1(t,\omega)$ in the voltage-controlled LC oscillator with a changed frequency. Depending on the realization of the varactor, an increase or reduction in the voltage can lead here either to a lowering or raising of the frequency. The advantage in operation of the LC oscillator at a lower oscillation frequency than the resonance frequency is that the LC oscillator can be designed as a whole for a lower oscillation frequency. The advantage in operation of the LC oscillator at a higher oscillation frequency than the resonance frequency is that signal demodulation is simplified. The form of the change is likewise not restricted here and can, as already mentioned, be formed e.g. in a stepped or sawtooth-shaped manner or as a peak. The choice of frequencies is geared to the required power density at the resonance frequencies of the sample. The duration, number and shape of the time-dependent waveforms are selected according to the demands on the transient magnetic field made by the sample (see above).

To generate transient magnetic fields with a defined phase, the LC resonator can moreover be realized in a phase-locked loop having switchable reference frequency and phase, such as corresponds to an exemplary embodiment.

Since a current flows through the coil of the LC oscillator as soon as this is turned on, a $B_1$ field is also directly generated. The amplitude of the $B_1$ field needs a certain time, however, until it has reached a desired value. It is therefore advantageous to switch the LC oscillator from a first frequency, which lies far enough from the resonance frequency not to cause any excitation in the sample, to a second frequency (resonance frequency), as in this way a transient response is reduced to negligible, extremely short changes in the amplitude. For the times in which no excitation of the sample magnetization is to take place, the LC oscillator should generally be operated constantly at the first frequency in order to avoid or sharply reduce transient responses.

A first time-dependent waveform is supplied as control voltage to the LC oscillator.

A second, likewise time-dependent waveform, which suffices to adjust the envelope of the transient magnetization of the LC oscillator, is input into the supply voltage of the LC oscillator, if necessary with the aid of further circuit elements.

The transient magnetic field $B_1$ $(t,\omega)$, which is generated thus by the LC oscillator, is sufficient in frequency and envelope at least to deflect a magnetization of a sample in the $B_0$ field out of its state of equilibrium. This applies e.g. to experiments for detecting Rabi oscillations, spin echoes or in simple FID (free induction decay) measurements, for which single pulses are sufficient.

Means for generating the first and second time-dependent waveform, which are input into the LC oscillator, are used as means for controlling the LC oscillator. These means are, for example, digital-to-analog converters, controlled by personal computer, FPGA (Field Programmable Gate Array programmable local gate arrangement), microcontrollers, "arbitrary waveform" generators or simple ramp or pulse function generators.

Simultaneously to the transient magnetic field $B_1(t,\omega)$ acting on the sample and/or consecutively to this in time, the time-dependent change in the magnetization (transient) of the sample is detected. The change in the magnetization of the sample causes a change in the inductive element of the LC oscillator, which can be detected as a change in the oscillation frequency and/or oscillation amplitude of the LC oscillator in an output voltage of the same. To do this, the output voltage of the LC oscillator is tapped and, if applicable, an amplitude-modulated signal of the oscillator is tapped directly at internal voltage nodes.

The changes in the oscillation frequency and/or oscillation amplitude are detected by demodulation connected downstream of the LC oscillator. The demodulation takes place in this case either using a frequency demodulator or an amplitude demodulator, as corresponds respectively to embodiments. A combination of a frequency demodulator with an amplitude demodulator corresponds to another embodiment. Conversion of the analog signals into digital signals takes place depending on the selected converters or demodulators before or after the conversion or demodulation.

The digital, converted and/or demodulated signals are supplied to digital data processing. There they are processed further by a means for determining spectral components of the magnetization of the sample based on a model of transient inductance and transient resistance of a coil, which is provided at the data processing facility. The spectral components (original spectral lines of a sample) are used in turn to determine resonance energies (e.g. expressed via the Landé factor (g factor/g tensor) or the ratio of resonance frequencies of a sample and $B_0$).

The model of transient inductance and transient resistance of a coil is introduced below in four sections:
1. Complex susceptibility/permeability;
2. Prior art for the modelling of a use of an LC oscillator for manipulating and detecting a magnetization of a sample under continuous wave conditions;
3. Modelling of a use of an LC oscillator for manipulating and detecting a magnetization of a sample under transient conditions;
4. Relationship between the frequency of oscillation and the amplitude of an LC oscillator and the inductance and the effective resistance of the inductive element used.

Let it be noted for the purposes of explanation that a distinction is drawn between the free oscillation frequency of the LC oscillator $\omega_{osc0}$, which is present when the oscillator oscillates in an uninfluenced manner, and an oscillation frequency that is influenced by the magnetization of a sample, $\omega_{osc0,\chi}$. In addition, the general case with an oscillation frequency $\omega_{osc}$ is also observed.

1. Complex Susceptibility/Permeability

The $B_1$ field and the magnetic field strength $H_1$ within a linear sample are proportional to one another at sufficiently (sample-dependent) low frequencies of the $B_1$ field. This corresponds to a real-valued relative permeability $\mu_r$ and the susceptibility $\chi_m$ of the sample, the connection of which is $\mu_r = 1 + \chi_m$. At higher frequencies of the $B_1$ field, a time shift can occur between the $B_1$ field and the field strength $H_1$. This time shift can be mapped for the special case of sinusoidal time curves as complex permeability and susceptibility of the sample, according to $$\underline{\mu_r} = \mu_r{'} - j \cdot \mu_r{''} \text{ und } \underline{\chi_m} = \chi_m{'} - j \cdot \chi_m{''}.$$

The complex permeability and susceptibility are described in greater detail, for example, in Article 4 by N. Bloembergen and R. V. Pound (Radiation Damping in Magnetic Resonance Experiments, Physical Reviews, Vol 95 (1), 1954, P. 8-12).

2. Prior Art for the Modelling of a Use of an LC Oscillator for Manipulating and Detecting a Magnetization of a Sample Under Continuous Wave Conditions In Article 3 by T. Yalcin and G. Boero, a method is disclosed by means of which LC oscillators can be used for continuous wave ESR experiments. The method is based on the principle that the current that flows through the coil of the LC oscillator generates a continuous (continuous wave) microwave magnetic field ($B_1$), to which a sample is exposed. This field ($B_1$) influences the magnetization of the sample, which can be detected in turn in the LC oscillator as a change in the frequency. The connection between the static magnetic field $B_0$, the microwave field $B_1$ and the spin-based magnetization of the sample $M_s$, as sum of the magnetization of a spin ensemble $M_x$, is introduced as $$M_x = (\chi' \cdot \cos(\omega_{osc0} \cdot t) + \chi'' \cdot \sin(\omega_{osc0} \cdot t)) \cdot 2H_1$$

where $\omega_{osc0}$ is the frequency of the magnetic field strength $H_1$, the free oscillation frequency, and t is the time. The free oscillation frequency of the oscillator must correspond to the Larmor frequency under excitation conditions or be close to this. A complex magnetization of the sample (see above), which connects the microwave field strength $H_1$, according to $H_1 = B_1/\mu_0$, to the stationary magnetization of a spin ensemble $M_x$ under continuous wave excitation, is taken into account in this case.

3. Inventive Modelling of a Use of an LC Oscillator for Manipulating and Detecting a Magnetization of a Sample Under Transient Conditions The model of the relationship between a spin ensemble $M_x$, the static magnetic field $B_0$ and the microwave field $B_1$, which, as shown above, is used to describe continuous wave ESR experiments with the use of LC oscillators, is only applicable to the stationary state of a magnetization. This follows from the fact that this model is based on a notation for a pointer or, expressed mathematically, on a solution of a differential equation using the Fourier transformation, which permits the introduction of a time-independent, complex susceptibility as a quotient from the pointer of the magnetization and the magnetic field strength $H_1$ only for sinusoidal excitations of an unlimited duration.

To lift this restriction and describe the effect that a temporally variable magnetic field (transient magnetic field $B_1(t, f)$) has on the magnetization of a sample, the new model is introduced, which relates the immediate $B_1$ field and the sample magnetization $M_s$ to a sample-dependent, temporally variable inductance and a sample-dependent, temporally variable resistance of the coil of the LC oscillator. This general approach naturally comprises the borderline case of stationary microwave excitation.

It generally applies that if a magnetic field strength H is generated by a current flow in a coil and penetrates a sample, a magnetic field B is generated in the sample depending on its material properties according to $$\vec{B} = \mu_0 \cdot \vec{H} + \vec{M} = \mu_0 \cdot (\vec{H} + \chi_m \cdot \vec{H}) = \mu_0 \cdot 1 + \chi_m) \cdot \vec{H} = \mu_0 \cdot \mu_r \cdot \vec{H} \quad (1.1)$$

where $\vec{M}$ is the magnetization of the sample, $X_m$ its magnetic susceptibility and pr its relative permeability.

Furthermore, it is generally known that the magnetic field strength H and the B field having an energy density per unit of volume $w_m$ can be connected according to $$w_m = \vec{B} \cdot \vec{H} = \vec{B} \cdot \left(\frac{1}{\mu_0} \cdot \vec{B} - \vec{M}\right) = \frac{1}{\mu_0} \cdot \vec{B} - \vec{B} \cdot \vec{M}. \quad (1.2)$$

If the current flow that causes the magnetic field strength H is temporally variable, the rate of change of the magnetic energy can be linked to a power output according to $$P = \frac{\partial W_m}{\partial t} = v(t) \cdot i(t) = \left[\frac{d[L(t) \cdot i(t)]}{dt} + R_{sample}(t) \cdot i(t)\right] \cdot i(t), \quad (1.3)$$

where $W_m = \int w_m dV$ is the total magnetic energy linked to the induction coil, v(t) is the voltage drop across the coil, i(t) is the associated current flow, L(t) the temporally variable inductance, which can be linked to the magnetic field in the coil. $R_{Sample}(t)$ here models a possible, temporally variable loss, which is caused by the magnetization of the sample.

By combining (1.2) with (1.3), the following is obtained:

$$P = \int_V \left[\frac{1}{\mu_0} \cdot \frac{d}{dt}[B(t)]^2 - \frac{d}{dt}[\vec{B}(t) \cdot \vec{M}(t, \vec{r})]\right] dV \quad (1.4)$$

$$= \left[\frac{d}{dt}L(t) \cdot i(t) + L(t) \cdot \frac{d}{dt}i(t) + R_{sample}(t) \cdot i(t)\right] \cdot i(t)$$

with $\vec{r}$=distance vector from the origin for the integration via the volume.

Assuming that the $B_1$ field (in the sample) is induced by a current flow in the coil according to $\vec{B}_1 = \vec{B}_u \cdot i(t)$ where $\vec{B}_u$ is the so-called unitary magnetic field, the equation (1.4) is rewritten to:

$$\int_V \left[\frac{1}{\mu_0} \cdot \vec{B}_u^2(\vec{r}) \cdot \frac{d}{dt}[i(t)]^2 - \vec{B}_u(\vec{r}) \cdot \frac{d}{dt}[i(t) \cdot \vec{M}(t, \vec{r})]\right] dV = \quad (1.5)$$

-continued $$\frac{1}{\mu_0} \cdot \int_V \left[\vec{B}_u^2(\vec{r}) \cdot \frac{d}{dt}[i(t)]^2\right] dV -$$

$$\int_{V_s} \left[\vec{B}_u(\vec{r}) \cdot \frac{d}{dt}[i(t)] \cdot \vec{M}(t, \vec{r}) + \vec{B}_u(r) \cdot i(t) \cdot \frac{d}{dt}[\vec{M}(t, \vec{r})]\right] dV =$$

$$\left[\frac{d}{dt}L(t) \cdot i(t) + L(t) \cdot \frac{d}{dt}i(t) + R_{sample}(t) \cdot i(t)\right] \cdot i(t) = \left[\frac{d}{dt}L(t) + R_{sample}(t)\right] \cdot i^2(t) + L(t) \cdot i(t) \cdot \frac{d}{dt}i(t) =$$

$$\left[\frac{d}{dt}L(t) + R_{sample}(t)\right] \cdot i^2(t) + \frac{1}{2} \cdot L(t) \cdot \frac{d}{dt}[i(t)]^2$$

with $V_s$=sample volume.

By comparing the expressions on the left and right side of the equation and by replacing the inductance L(t) with a combination of an expression $L_0$, independent of the sample, of the inductance of the coil and a sample-dependent expression $\Delta L_{sample}$ for the detectable inductance of the sample in the transient magnetic field according to $L(t) = L_0(t) + \Delta L_{sample}(t)$, the following expressions are found for $L_0$, sample $\Delta L_{sample}$ and $R_{sample}$:

$$L_0 \equiv 2 \cdot \int_V \left[\frac{1}{\mu_0} \cdot \vec{B}_u^2(\vec{r})\right] dV \quad (1.6)$$

$$\Delta L_{sample}(t) \equiv \int_{V_s} \left[-\vec{B}_u(\vec{r}) \cdot \frac{\vec{M}(t, \vec{r})}{i(t)}\right] dV$$

$$\frac{d}{dt}\Delta L_{sample}(t) + R_{sample}(t) = \int_{V_s} \left[-\vec{B}_u(\vec{r}) \cdot \frac{\frac{d}{dt}[\vec{M}(t, \vec{r})]}{i(t)}\right] dV$$

$$\leftrightarrow R_{sample}(t) \equiv \int_{V_s} \left[-\vec{B}_u(\vec{r}) \cdot \frac{\frac{d}{dt}[\vec{M}(t, \vec{r})]}{i(t)}\right] dV - \frac{d}{dt}\Delta L_{sample}(t).$$

The magnitude $L_0$ can be determined directly via the geometry of the coil.

It follows from equation (1.6) that the presence of a temporally variable magnetization leads to a change in the inductance in the sample, which is proportional to the integral of said magnetization over the entire sample, which is standardized to the current flow in the induction coil according to $$\Delta L_{sample}(t) \equiv \int_{V_s} \left[-\vec{B}_u(\vec{r}) \cdot \frac{\vec{M}(t, \vec{r})}{i(t)}\right] dV = \int_{V_s} \left[-\vec{B}_1(\vec{r}) \cdot \frac{\vec{M}(t, \vec{r})}{i^2(t)}\right] dV, \quad (1.7)$$

and is comprised as a term in an embodiment of means for determining spectral components of the magnetization of the sample on the basis of the physical model of transient inductance and transient resistance of a coil.

The equation (1.7) is checked for consistency with the results found in Article 3 for the continuous wave case. For the borderline case of a continuous (continuous wave) excitation, $\vec{B}_1$ and i(t) are given by $\vec{B}_1 = \vec{B}_1 \cdot \cos(\omega_{osc,\chi} \cdot t)$ and $i(t) = i \cdot \cos(\omega_{osc,\chi} \cdot t)$ ($\vec{B}_1$ and $\hat{i}$ 1 are the amplitudes of said magnitudes). It follows from this that $$i^2(t) = \frac{1}{2} \cdot (1 + \cos(2\omega_{osc,\chi} \cdot t)).$$

In the continuous wave case, only the stationary signal is detected, due to which the temporally variable portion of $i^2(t)$ is averaged out and the detectable inductance of the sample in the continuous wave experiment is given by $$\Delta L_{sample,CW}(t) = Re\left\{\int_{V_s}\left[-\vec{B}_u(\vec{r}) \cdot \vec{M}(t,\vec{r})\right]dV\right\} = \qquad (1.8a)$$

$$-\int_{V_s} \vec{B}_u(\vec{r}) \cdot \frac{\chi' \cdot \vec{B}_u(\vec{r})}{\mu_0} dV = -\frac{1}{\mu_0}\int_{V_s}\chi'\left(\vec{B}_u(\vec{r})\right)^2 dV$$

For a value of its susceptibility $\chi'$ that is constant over the entire volume of the sample, this expression can be further simplified to $$\Delta L_{sample,CW} = \qquad (1.8b)$$

$$-\chi'\left(\int_{V_s}\left(\vec{B}_u(\vec{r})\right)^2 dV = -\chi'\int_{V_s}\left(\vec{B}_u(\vec{r})\right)^2 dV \cdot \frac{\int_V\left(\vec{B}_u(\vec{r})\right)^2 dV}{\int_V\left(\vec{B}_u(\vec{r})\right)^2 dV}\right. =$$

$$\left. -\chi' \cdot \frac{\left(\int_{V_s}\left(\vec{B}_u(\vec{r})\right)^2 dV\right)}{\int_V\left(\vec{B}_u(\vec{r})\right)^2 dV} \cdot \int_V\left(\vec{B}_u(\vec{r})\right)^2 dV = -\chi' \cdot \eta \cdot L_0,\right.$$

where $\eta$ is the so-called fill factor (corresponds to the ratio of sample volume to total volume of the coil). This matches exactly the result from Article 3.

Moreover, the effective coil resistance, which is present due to the influence of the sample on the coil, is modified to $$R_{sample,tot}(t) = \qquad (1.9)$$

$$\frac{d}{dt}\Delta L_{sample}(t) + R_{sample}(t) = \int_{V_s}\left[-\vec{B}_1(\vec{r}) \cdot \frac{\frac{d}{dt}\left[\vec{M}(t,\vec{r})\right]}{i^2(t)}\right]dV.$$

It follows from this that, in contrast to the inductance of the coil, the change in the resistance of the coil is proportional to the integral of the temporal derivation of the sample magnetization via the sample volume, standardized to the coil current.

It should be noted that it directly follows from the modulation of $\vec{B}_1$ with $\vec{M}$ and $$\frac{d}{dt}\vec{M}$$

in equation (1.7) and (1.9) that both the change in the inductance related to the sample and the change in the resistance of the coil related to the sample contain spectral components at frequencies $\omega_{osc0} \pm \omega_i$. The assumption of spectral components of the sample magnetization at $\omega_i$ and piecewise (i.e. temporally limited) sinusoidal current flows in the coil $(i(t)=i\cdot\cos(\omega_{osc0}\cdot t)$ for $t\in[t_1,t_2]$, with $\omega_{osc0}$=frequency of the coil current (or of the oscillator) and $t_1$, $t_2$ arbitrary starting and end times was used as a starting point. Spectral components, which belong to the DC portion in $$i^2(t) = \frac{1}{2} \cdot (1 + \cos(2\omega_{osc,0} \cdot t)),$$

are the frequencies to be used, and high-frequency components resulting from the fluctuating portion in $$i^2(t) = \frac{1}{2} \cdot (1 + \cos(2\omega_{osc,0} \cdot t))$$

are undesirable.

4. Relationship Between the Frequency of Oscillation and the Amplitude of an LC Oscillator and the Inductance and the Effective Resistance of the Inductive Element Used It is shown in the following how the changes in the inductance and the effective resistance of a coil are related to a change in the frequency and amplitude of an oscillation of the coil if this is part of an LC oscillator.

Disregarding effects of a higher order, the frequency of an oscillator can be described as a function of the inductance of the resonant circuit L, its capacitance C and the equivalent conductance of the resonant circuit $$G_t \approx \frac{R_{eff}}{\omega_{LC}^2 \cdot L_0^2},$$

with $R_{eff}$=effective resistance of the coil (general case) and $$\omega_{LC} = \frac{1}{\sqrt{L_0 \cdot C}} = \text{resonance frequency of the resonant circuit,}$$

according to $$\omega_{osc,\chi} = \frac{1}{\sqrt{L_{eff} \cdot C}} \cdot [1 - f(L_{eff}, C, G_t, G_m)] \approx \frac{1}{\sqrt{L_{eff} \cdot C}}, \qquad (1.10)$$

with $G_m$ the transconductance of the active transistor, which causes the negative resistance, which is used to stabilize the oscillation. Furthermore, equation (1.10) is simplified by the fact that $f(L, C, G_t, G_m) \ll 1$ is for every practically utilizable LC oscillator. If the effective inductance of the coil is also written as a portion dependent on and independent of the sample (see also above) $L_{eff}=L_o+\Delta L_{sample}$, and it is further assumed, as is valid for most practical applications, that $\Delta L_{sample} \ll L_0$, an approximation function for the frequency of an LC oscillator, which comprises a sample with a temporally variable magnetization in the excitable region of its coil, is set up according to $$\omega_{osc,\chi} \approx \frac{1}{\sqrt{L_{eff} \cdot C}} = \qquad (1.11a)$$

-continued $$\frac{1}{\sqrt{[L_0 + \Delta L_{sample}] \cdot C}} \approx \frac{1}{\sqrt{L_0 \cdot C}} - \frac{1}{2} \cdot \frac{1}{(L_0 \cdot C)^{\frac{3}{2}}} \cdot C \cdot \Delta L_{sample}.$$

The approximation function is terminated after the 2$^{nd}$ term and under the negligible portion of higher terms (1.11b)

$$\omega_{osc,\chi} = \frac{1}{\sqrt{L_0 \cdot C}} - \frac{1}{2} \cdot \frac{1}{(L_0 \cdot C)^{\frac{3}{2}}} \cdot C \cdot \Delta L_{sample} \quad (1.11b)$$

is set as the term for modelling the spectral components of a sample, which is comprised in one embodiment of means for determining spectral components of the magnetization of the sample on the basis of the physical model of transient inductance and transient resistance of a coil.

Since the inductance $\Delta L_{sample}$ related to the sample is proportional according to equation (1.9) to the integral of the magnetization of the sample normalized to the current flow in the coil, the frequency of the oscillation consequently incorporates the proportionality given in equation (1.9). A temporally variable magnetization of a sample can thus be determined by detecting the instantaneous value of the oscillation frequency of the LC oscillator ($\omega_{osc,\chi}$). In addition, the spectral components of the inductance at $\omega_{osc} \pm \omega_i$ which belong to the sample and are produced by the change in the inductance of the sample-related portion $\Delta L_{sample}$, cause a modulation of the frequency of the oscillator with the modulation frequency $\omega_{osc} \pm \omega_i$ and thus generate spectral components in the voltage of the oscillator at $\omega_{osc0} \pm (\omega_{osc} \pm \omega_i)$. These components can be determined by standard demodulation of the frequencies (FM, frequency modulation) and thereby enable the determination of the inductance of the sample $\Delta L_{sample}$. Its magnetization and the associated spectral components and the resonant behavior are then determined from this.

The oscillation amplitude of an LC oscillator generally depends both on the effective inductance $L_{eff}$ and on the effective resistance $R_{eff}$ of the coil used, the dependence on the resistance being much stronger. The oscillation amplitude $A_{osc}$ can thus generally be written as $$A_{osc} = f(R_{eff}, L_{eff}, C, G_m). \quad (1.12a)$$

Since the spin-induced changes in the coil resistance are generally small compared with the ohmic coil resistance $R_0$, the equation 1.12a can be rewritten, using a Taylor series, which is terminated after the 2$^{nd}$ term, disregarding higher terms, as $$A_{osc} = A_{osc}\bigg|_{R_{eff}=R_0} + \frac{\partial A_{osc}}{\partial R_{eff}}\bigg|_{R_{eff}=R_0} \cdot R_{sample,tot} \quad (1.12b)$$

Equation 1.12b is set as the term for modelling the spectral components of a sample, which in another embodiment is comprised of means for determining spectral components of the magnetization of the sample based on the physical model of transient inductance and transient resistance of a coil. This equation depends on the oscillator used and must be adapted for the specifically applied instance.

In the case of an LC-VCO, the equation 1.12b is concretized to $$A_{osc} = 8 \cdot \sqrt{\frac{2}{3}} \cdot \frac{n \cdot I_{BIAS}}{G_m} \cdot \sqrt{1 - \frac{2 \cdot R_0}{\omega_{LC}^2 \cdot L_0^2}} + \frac{\partial A_{osc}}{\partial R_{eff}}\bigg|_{R_{eff}=R_0} \cdot R_{sample,tot}$$

with n=emission factor in the sub-threshold range and $I_{BIAS}$=DC quiescent current of the oscillator (bias current).

The function 1.12b is set up on the basis that, of most experimental conditions, the ohmic coil resistance $R_0$ is significantly greater than the change in the coil resistance $R_{sample,tot}$ induced by the sample. In contrast to the change in the inductance $\Delta L_{sample}$ induced by the sample, the change in the resistance $R_{sample,tot}$ induced by the sample leads chiefly to modulations of the amplitude of the oscillation frequency of the coil (i.e. of the oscillator). The modulations of the amplitude produce spectral portions in the oscillator output voltage at $\omega_{osc0} \pm (\omega_{osc} \pm \omega_i)$, which can be determined in turn by standard demodulation of the amplitude (AM, amplitude demodulation) and thus also the magnetization and the associated spectral components and resonant behavior.

Accordingly, following conventional FM and AM demodulation, the spectral components of the magnetization at frequencies of $\omega_{osc} \pm \omega_i$ can be detected and, since the oscillation frequency $\omega_{osc0}$ is known, can thus be associated unambiguously and quantitatively with spectral components at the frequencies $\omega_i$.

FM and AM demodulation can be of differing complexity in their execution here, so that differences result here in the detector hardware. For example, in the case of the LC tank oscillator, there is a node with intrinsic AM demodulation, at which this can be tapped. Principles for amplitude detection in a CMOS LC oscillator are given in Article 5 by P. Kinget (Amplitude detection inside CMOS LC oscillators, 2006 IEEE International Symposium on Circuits and Systems, Vol. 1-11, Proceedings 2006, P. 5147-5150). For the FM demodulation, e.g. phase-locked loops (analog or digital) or so-called Teager energy operators are used.

A detection of both spectra, such as corresponds to one embodiment, has the advantage that an intrinsic "baseline calibration" can be undertaken, i.e. spectral components that appear in both spectra are to be regarded as genuine, whereas all others are so-called measurement artifacts.

The spectral components established are used, as already mentioned, to determine resonance energies, e.g. expressed via the Landé factor (g factor/g tensor) or the relationship of resonance frequencies of a sample and the magnetic field $B_0$ or its transient behavior (e.g. relaxation). These are output by the data processing system using suitable means for this, in order to supply them e.g. for use in process control or quality control and to use them for imaging magnetic resonance tomography.

The new model for processing the signals from the device according to embodiments of the invention, which model is used to determine the spectral components of a sample, makes it possible for the first time to analyze the behavior of a coil with regard to the effects of transient magnetization of a sample in such a way that the spectral components necessary for the sample characterization can be provided. This in turn makes possible for the first time the reduction and miniaturization of the design of a pulsed ESR or NMR experiment comprising an LC oscillator as transmission and receiving station.

In addition, embodiments of the invention thus advantageously provide a devices for generating and detecting a transient magnetization of a sample that do not require a resonator. Detection of the magnetization of the sample is thus possible during the excitation or during the application of the transient magnetic field. This opens up ESR and NMR experiments with a hitherto unrealized time resolution of a measurement of the transient magnetization of the sample.

Another advantage of using LC oscillators for transient experiments is that, compared with resonator-based detection, no "duplexer" or "circulator" is required for decoupling the transmission and receiving device and thus a further reduction in components and simplification of the device are achieved.

The device can be miniaturized if necessary, as all the required components can be implemented in integrated circuit technology.

In addition, the alternating current output of the oscillators is converted directly into the desired $B_1$ field by the high-frequency (RF/microwave) current that runs through the coil, without running through a 50Ω circuit environment. Less power needs to be generated as a whole by this at the Larmor frequency and electrical energy can thus be saved.

In one embodiment, the first and second time-dependent waveform are generated by a data processing system (for example, a personal computer), digital-analog converters being connected upstream of the LC oscillator.

In another embodiment, the digital-analog converter for the second time-dependent waveform is integrated in the current source of the LC oscillator. This causes less parasitic capacitance in the supply lines, so that higher time resolutions can be achieved in the modulation of the envelope of the $B_1$ field. This circumstance is important for the so-called "optimal control pulses" derived from the optimal control theory. Using the optimal control theory, it can be mathematically calculated which envelope and phase the $B_1$ field should have in order to manipulate the spin magnetization as efficiently as possible.

In a third embodiment, the execution of the LC oscillator is realized by an LC-VCO (Voltage Controlled Oscillator). The use of LC-VCOs enables an independent adjustment of frequency and amplitude of the oscillator and thus also of frequency and amplitude of the $B_1$ field, which is advantageous for optimization of the experimental conditions.

The circuit arrangement of the LC-VCO is preferably designed as follows as according to one embodiment. A differential capacitance diode (varactor) and a differential inductor are used to form the LC resonant circuit. Two cross-coupled transistors guarantee a stable oscillation in the differential output (i.e. the output voltage) by negative resistance and non-linearity between two nodal points. The tuning properties are guaranteed by the differential capacitance diode. The time-dependent variation of the oscillation amplitude is e.g. implemented by manipulation of the voltage supply of the LC-VCO. This simple execution of an LC-VCO guarantees a low power consumption, small space requirement and also operates even at low (down to cryogenic) temperatures.

The LC-VCO is expanded in another embodiment by a voltage-controlled current source, which is realized in a next embodiment as a digital current controller. The additional current source makes it possible to adapt the amplitude of the B field. The division into a non-variable and variable portion of the current source makes the design of the variable portion easier, as for a desired resolution in the control of the current supply a lower resolution is required in the digital bit width (of the control of the current source).

A down converter having quadrature paths for processing the output voltage of the LC oscillator, which is connected downstream of the latter, likewise corresponds to an embodiment of the LC oscillator. Quadrature detection prevents the loss of information about magnetization components that change quickly in time (connected to short relaxation times). The quadrature mixing makes possible in this case a frequency of the LC oscillator that is sufficiently distant from the resonance frequency without exciting the sample. Here the resonance frequency of the sample must only be a little above the frequency of the LC oscillator or can even be below this. This in turn saves power and facilitates the design of devices for generating and detecting a transient magnetization of a sample, which can be operated with very high $B_0$ fields, >2 T. Converters that are placed e.g. on a monolithic integration together with the LC oscillator make down-conversion with low power consumption possible, as e.g. no high-frequency 50Ω buffer is needed.

A phase-locked loop having two reference oscillators is integrated by circuit technology into the LC-VCO in one embodiment. This guarantees that in a sequence of excitation pulses (transient magnetic fields) in an ESR or NMR experiment, the phase information of consecutive pulses is not lost upon switching the LC-VCO between a resonance frequency and a frequency remote from this.

The embodiments cited can be combined unrestrictedly taking circuit technology aspects into account.

The device can also be implemented in that the LC oscillator is used only in its function of transmission station for generating a $B_1$ field, the detection of the magnetization of the sample taking place by additional means. These additional means can be other oscillators or resonators (inductive). However, detection can also take place mechanically, electrically or optically.

A sample of which the magnetic properties are to be determined is arranged at a sample location. The sample location is a location in a device for generating and detecting a transient magnetization of a sample, at which location both the static or dynamic (gradient) magnetic field ($B_0$) and, if applicable, the transient magnetic field ($B_1$) are applied.

A static or dynamic magnetic field of a predetermined direction and strength is provided at the sample location. The magnetic field corresponds to the magnetic field $B_0$, which is used to magnetize a sample. The magnetic field can be of any strength here as long as the frequency of an excitation $B_1$ magnetic field is selected in accordance with the resonance conditions.

A transient magnetic field, which corresponds to the excitation magnetic field $B_1$, is generated by an LC oscillator, the oscillation frequency of which depends on the value of an inductive element of the LC oscillator. The arrangement of the LC oscillator is selected so that the sample or the sample location is located in the near field of the LC oscillator.

Transient magnetic fields here are magnetic fields which are generated by a change in the frequency in the LC oscillator that is of a limited duration. The form of the change is not limited here and can occur e.g. in a stepped or sawtooth-shaped manner or as a peak.

The duration, number and form of the transient magnetic fields are selected according to the requirements of the sample and the desired manipulation of the spin ensemble in the sample.

In the simplest case, the pulse length should be chosen depending on the sample such that the magnetization in the sample is tilted by $\theta=90°$ ($\theta=\gamma \cdot B_1 \cdot \tau_{puls}$, $\tau_{puls}$=duration of the application of the resonant $B_1$ field, $\gamma$=gyromagnetic ratio), as the transverse magnetization is maximized in this way, which is also detected by the LC oscillator.

The strength of the $B_1$ field is great enough here to generate 90° pulse lengths (θ=) 90° with $\tau_{puls}$ in the subnanosecond range, so that hereby in combination with the possibility of detection during the excitation, even so-called Rabi oscillations can be measured directly for samples with short $T_2$ relaxation times. The strength of the $B_1$ field is set here by suitable selection of the oscillator supply voltage and the oscillator quiescent current as well as by suitable selection of the coil inductance in relation to the frequency-determining capacitance.

The transient magnetic field, which is generated thus by the LC oscillator, is sufficient in frequency and envelope at least to deflect a magnetization of a sample in the $B_0$ field from its state of equilibrium.

The transient magnetization of the sample is detected as transient inductance and transient resistance of the coil of the LC oscillator by tapping an output voltage of the LC oscillators before, during and subsequent to the transient magnetic field. The change in the magnetization of the sample causes a change in the inductive element of the LC oscillator, which can be detected as a change in the oscillation frequency and/or oscillation amplitude of the LC oscillator in an output voltage of the same. To do this, the output voltage of the LC oscillator is tapped and, if applicable, an amplitude-demodulated signal of the oscillator is tapped directly at internal voltage nodes.

The changes in the oscillation frequency and/or oscillation amplitude are detected by frequency and amplitude demodulators connected downstream of the LC oscillator. Conversion of the analog signals into digital signals takes place depending on the converters or demodulators selected before or after conversion or demodulation.

The digital, converted and/or demodulated signals are supplied to digital data processing. They are processed there in a stored model of transient inductance and transient resistance of a coil to determine the original spectral lines of a sample.

The model corresponds to the model already introduced above for devices according to embodiments of the invention according to the sections cited there:
1. Complex susceptibility/permeability;
3. Modelling according to the invention of a use of an LC oscillator for manipulating and detecting a magnetization of a sample under transient conditions;
4. Relationship between the frequency of oscillation and the amplitude of an LC oscillator and the inductance and the effective resistance of the inductive element used.

According to the new model, following the conventional FM and AM demodulation, the spectral components of the magnetization can be detected at frequencies of $\omega_{RF} \pm \omega_i$ and, since the oscillation frequency is known, can thus be associated with spectral components unambiguously and quantitatively at the frequencies $\omega_i$.

Detection of both spectra has the advantage that an intrinsic "baseline calibration" can be undertaken, i.e. spectral components that are present in both spectra should be regarded as genuine. All others, on the other hand, are so-called measurement artifacts.

The spectral components established are used to determine resonance energies, e.g. expressed via the Landé factor (g factor/g tensor) or the relationship of resonance frequencies of a sample and the magnetic field $B_0$ or their transient behavior (e.g. relaxation), which are output by the data processing system in order to e.g. supply them for use in process control or quality control and to use them for imaging magnetic resonance tomography.

The new model for processing the signals from methods according to embodiments of the invention for determining the spectral components of a sample makes it possible for the first time to analyze the behavior of a coil with regard to the effects of transient magnetization of a sample in such a way that the spectral components necessary for sample characterization can be provided.

Methods according to embodiments of the invention also advantageously provide for generating and detecting a transient magnetization of a sample, in which signals can be detected for the detection of the magnetization of a sample during the excitation or during the application of a transient magnetic field. ESR and NMR experiments are thus possible with a hitherto unrealized temporal resolution of the measurement of transient magnetization.

FIG. 1 shows a schematic representation of a device according to an embodiment of the invention for generating and detecting a transient magnetization. A magnet 102, which can be, for example, a superconducting magnet, an electromagnet of any design or a permanent magnet, generates the static magnetic field B0 101 at a sample location, at which a sample 104 is arranged. The magnetic field B0 101 induces in the sample 104 a magnetization according to the susceptibility of the sample 104. An LC oscillator 103 generates a transient magnetic field B1. The LC oscillator 103 is controlled by a time-dependent waveform, which is used as control voltage $V_{(tune,\omega_{osc})}$ 108, by which the frequency of the oscillator 103 is determined, and a second time-dependent waveform, which is used to manipulate the amplitude of the oscillation of the LC oscillator 103 $V_{(tune,A_{osc})}$ 109. The time-dependent waveforms are provided here by a personal computer/digital data processing device 106 and converted by digital-to-analog converters 107/110. The output voltage V(osc,out) 105 of the LC oscillator 103 is supplied to FM and AM demodulators 111/113, converted by analog-to-digital converters 112/114 and then transferred to a data processing device 106, on which means are provided for determining spectral components of the magnetization of the sample on the basis of a physical model of transient inductance and transient resistance of a coil and from which the values established for the spectral components of the sample are output by a suitable means (not shown). Thus two means are realized here by the data processing device, means for controlling the LC oscillator and means for digital data processing, which can also be implemented separately.

Figure 2:
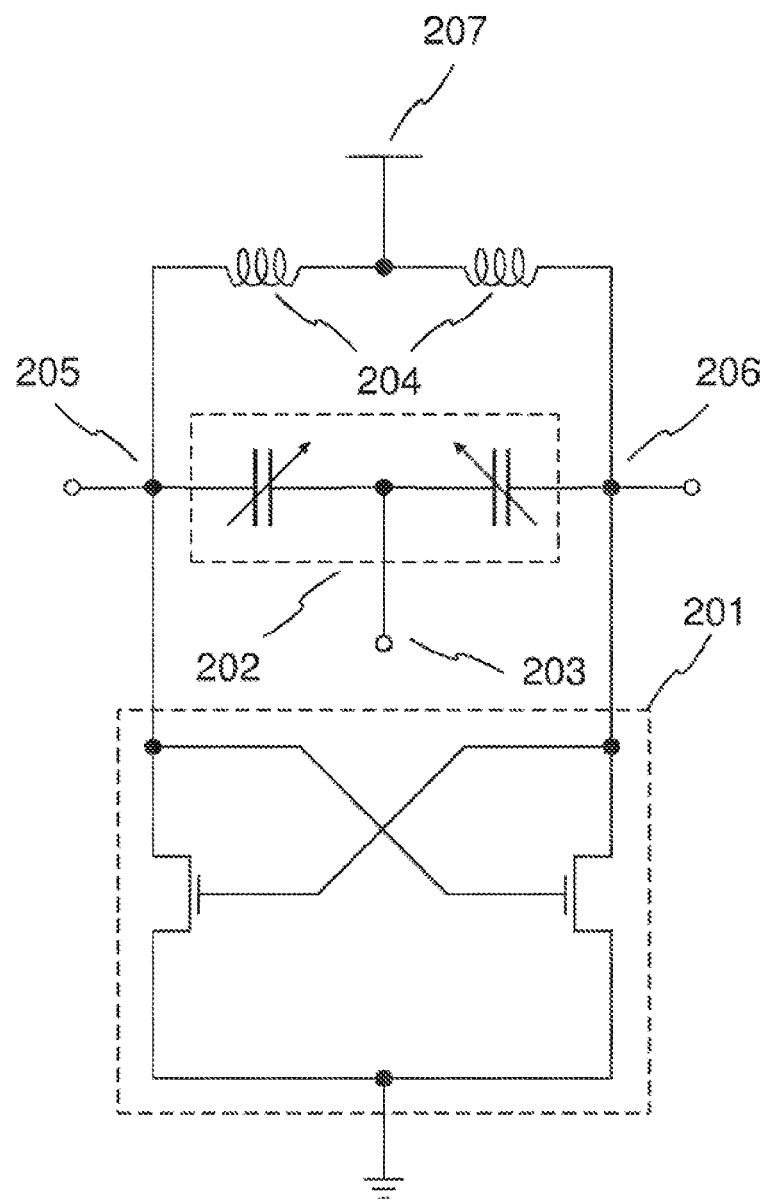
FIG. 2 depicts the design of an LC-VCO for use in a device for generating and detecting a transient magnetization.

FIG. 2 shows the design of an LC-VCO for use in a device according to an embodiment of the invention for generating and detecting a transient magnetization, such as corresponds to one embodiment. A differential capacitance diode (varactor) 202 and a differential inductor 204 are used to form the LC resonant circuit. Two cross-coupled transistors 201 guarantee a stable oscillation in the differential output (i.e. the output voltage) by negative resistance and non-linearity between two nodal points 205/206. The tuning properties are guaranteed by the differential capacitance diode 202 with the control voltage 203. The time-dependent variation of the oscillation amplitude is e.g. implemented by manipulation of the voltage supply of the LC-VCO. The oscillation amplitude is realized by the modulation of the supply voltage 207. This simple embodiment of an LC-VCO guarantees low power consumption, a small space requirement and in addition operates even at low (down to cryogenic) temperatures.

Figure 3:
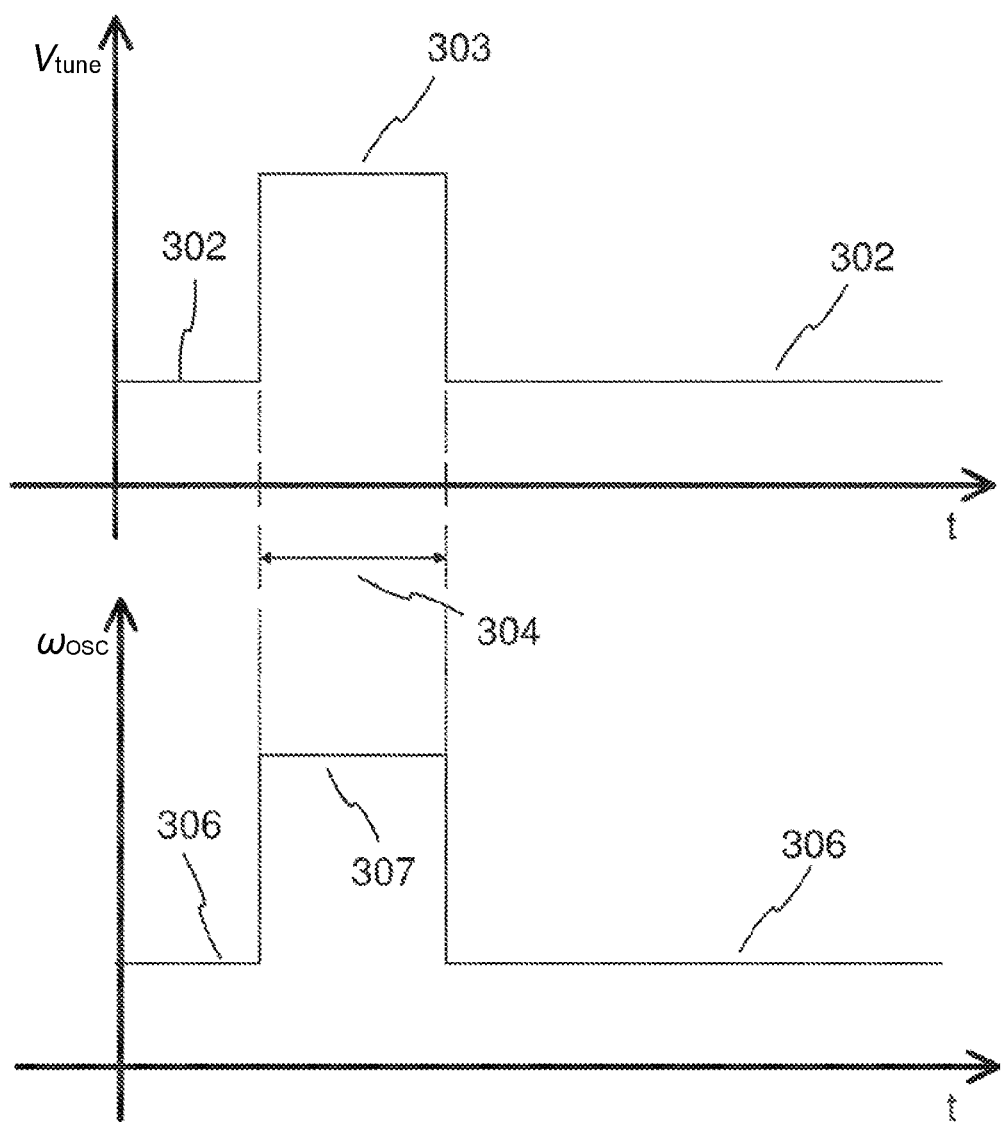
FIG. 3 illustrates the behavior over time of the control voltage Vtune of an LC-VCO and the resulting change in the oscillation frequency $\omega osc$ of the LC-VCO.

The effects of a time-dependent waveform, which includes a change with the duration τpuls 304 in the voltage and which is fed into an LC oscillator as control voltage, are shown in FIG. 3. The control voltage Vtune is switched in succession between the values Vtune1 302 and Vtune2 303 and produces an associated change in the free oscillation frequency ωosc0 of the LC oscillator, both of the oscillating voltage and of the current which runs through the coil of the LC oscillator. The oscillation frequency is switched in succession with a duration of approximately τpuls between the values ωosc1 306 and ωosc2 307. A free oscillation frequency is defined as the oscillation frequency at which the oscillator oscillates without the influence induced by the sample in the excited state.

Figure 4:
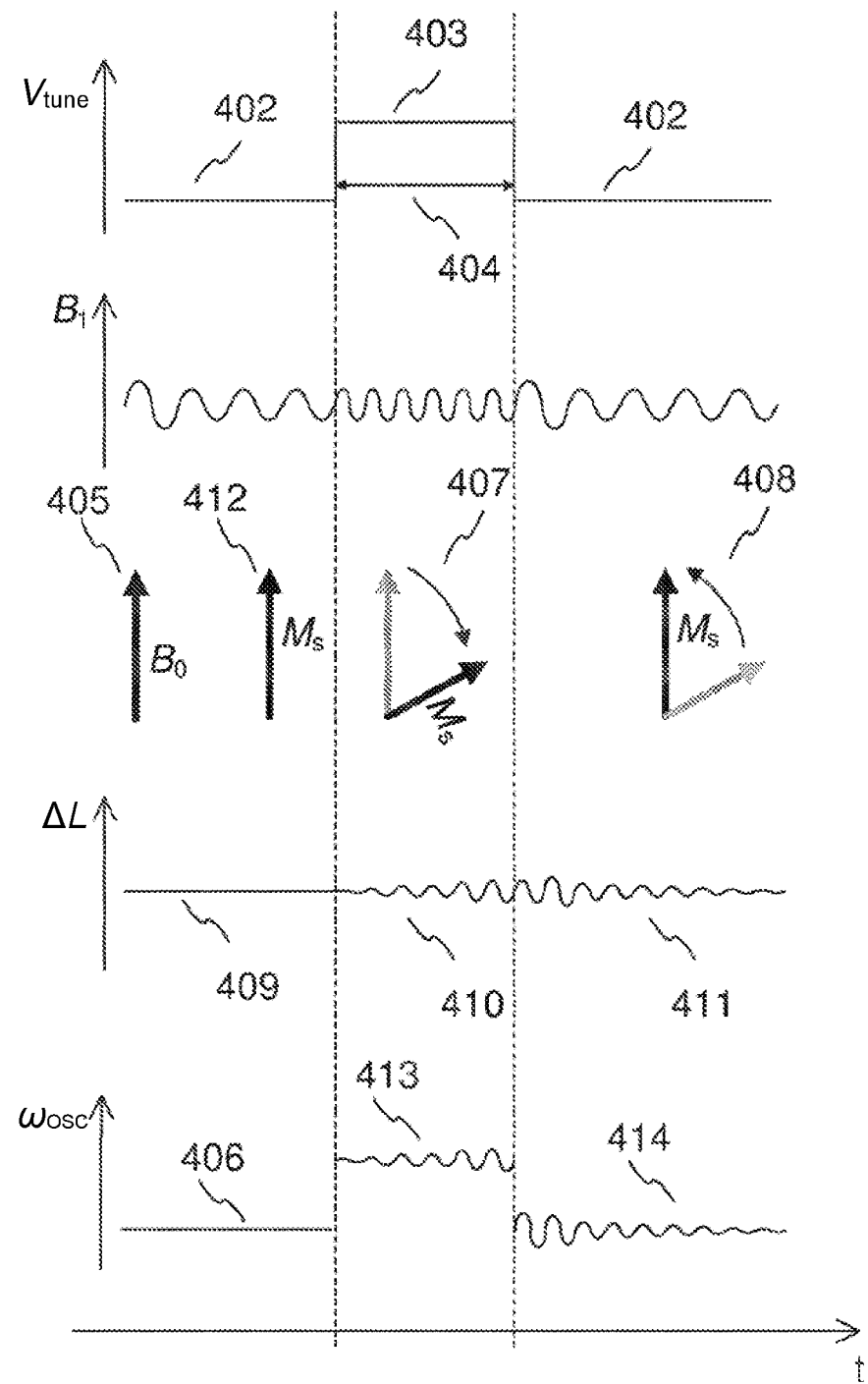
FIG. 4 illustrates the behavior over time of the control voltage Vtune of an LC-VCO, resulting change in the magnetic field $B_1$ of the resonant circuit of the LC-VCO, resulting change in the orientation of the magnetization Ms of the sample, resulting change in the effective inductance $\Delta L$ of the resonant circuit of the LC-VCO and resulting change in the oscillation frequency $\omega osc$ of the LC-VCO.

The temporal progression of the control voltage Vtune, Vtune1 402 and Vtune2 403 of an LC oscillator, which includes a change with the duration τpuls 404 in the voltage, the change resulting from this in the magnetic field B1 (transient magnetic field) of the resonant circuit of the LC oscillator are illustrated in the top two partial images in FIG. 4. The resulting change in the orientation of the magnetization Ms 412, 407 and 408 of the sample is shown in the partial image lying below. In the two lower partial images in FIG. 4, the corresponding courses of the resulting change in the effective inductance ΔL 409, 410 and 411 of the resonant circuit of the LC oscillator and the resulting change in the oscillation frequency ωosc 406, 413 and 414 of the LC oscillator are shown. The representation of the parameters involved in a measuring process refers to a common time axis, in order to illustrate the connections. In addition, the orientation of B0 405 is also shown. Vtune1 402 and Vtune2 403 correspond to the control voltages from FIG. 3 switched by the time-dependent waveform, which includes a change with the duration τpuls 404 in the voltage. The change in the magnetic field B1 of the resonant circuit of the LC oscillator causes a change in the magnetization Ms 412, 407 and 408 of the sample, which is shown in a so-called "rotating frame of reference" (rotation reference system), which is induced from B0 405, for which the rotational speed of the "rotating frame of reference" is selected as $-\gamma \cdot B0$. The change in the magnetization Ms of the sample is detected via the corresponding change in the frequency of the oscillation, the oscillation then corresponding to a frequency of the oscillator ωosc,χ influenced by sample magnetization, 413/414.

The change in the control voltage, with the duration τpulsE 404, causes a corresponding change in the frequency of the magnetic field B1, which is generated by the coil of the LC oscillator. The control voltages Vtune1 402 and Vtune2 403 are selected in this case so that the control voltage Vtune1 402 produces a free oscillator frequency 406, which has a sufficiently large distance from the resonance frequency resulting from the magnetization of the sample and the static magnetic field B0 405 and does not otherwise cause any excitation in the sample. The control voltage Vtune2 403 also produces a frequency that corresponds to the resonance frequency or is close enough to it to produce an excitation during the period τpuls 404. The sample magnetization MS is tilted by the excitation during the period τpuls 404 out of its state of equilibrium along the direction of the B0 field 405 and begins to precess with the Larmor frequency. According to the statements in section 1 of the introduction of the new model (see above under Task), this leads to a corresponding change in the inductance ΔL of the LC oscillator during the excitation. Here the oscillation frequency ωosc changes by an amount which corresponds to the change in the control voltage and is superposed by the change that is caused by the change in ΔL and that then corresponds to an ωosc,χ, 413. Following the excitation, the magnetization Ms of the sample precesses further about the axis of the field B0 405 and relaxes back into the state of equilibrium. This results in a change in the inductance of the coil ΔL even after excitation, which causes a corresponding change in the oscillation frequency ωosc 414 of the LC oscillator, which then likewise corresponds to a frequency of the oscillator influenced by the sample magnetization ωosc,χ.

Figure 5:
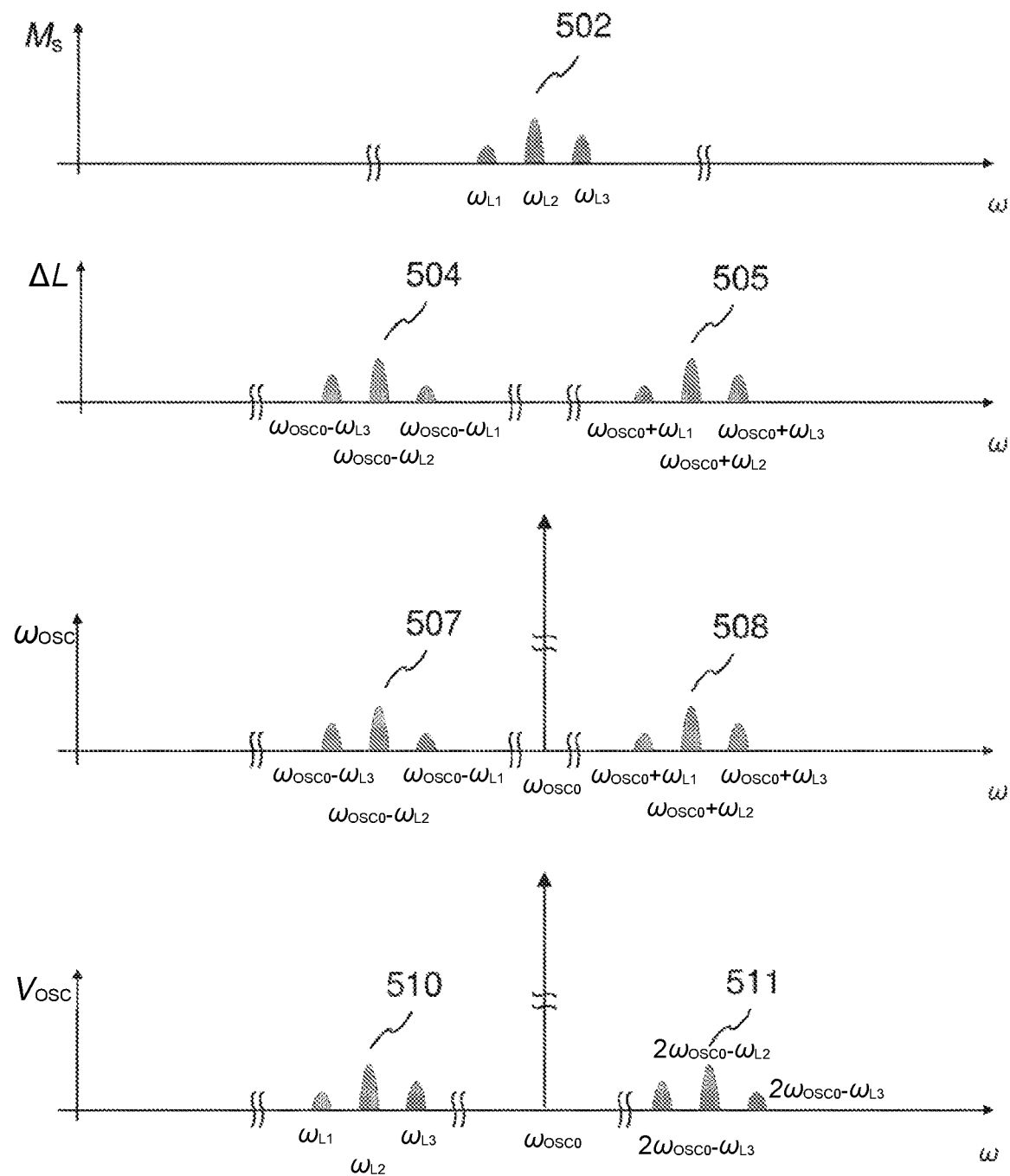
FIG. 5 depicts frequency spectra of the magnetization of the sample Ms, the oscillation frequency $\omega osc$ of a low-current LC-VCO and the oscillation voltage Vtune of the LC-VCO following an excitation pulse of the LC-VCO.

FIG. 5 shows the spectra of a spin-based magnetization Ms of a sample, of the corresponding changes in the inductance $\Delta L_{sample}$ of the coil of the LC oscillator, the resulting oscillation frequency ωosc and the frequency vosc of the associated control voltage Vtune following excitation, corresponding to the time period after τpuls 404 in FIG. 4. The representation relates to a common frequency axis to illustrate the connections. The representation of the spectra is based on the assumption that the spin-based magnetization is composed of three different spin ensembles having three different g factors, which produces a spectrum of the precessing magnetization with three different spectral lines at the frequencies ωL1,2,3 502. The frequencies ωL1,2,3 coincide with the frequencies of the spectral components of the sample magnetization ωi, which correspond here to Larmor frequencies. According to the statements in section 1 of the introduction of the new model (see above under Task), the precessing magnetization of the sample induces a change in the effective inductance of the LC oscillator. This change in inductance comprises frequency portions in the sum and the difference of the frequencies of the precessing magnetization and the free oscillation frequency following excitation according to ωosc0±ωL1,2,3 504/505. The corresponding oscillation frequencies ωosc according to ωosc0±ωL1,2,3 are likewise shown, 507/508.

According to equation (1.11a) and (1.11b) (see above), the change in the inductance of the coil in the sample-related portion ΔLsample results in an approximately proportional change in the oscillation frequency ωosc of the coil. The spectrum of this oscillation frequency ωosc therefore contains spectral lines at the same frequencies as those in the spectrum of the detected inductance changes of the sample from ΔLsample. These spectral lines are grouped about a large, central spectral line at the free oscillation frequency ωosc0=wosc(Vtune1). The smaller spectral lines resulting from the magnetization of the sample cause a weak modulation of the oscillation frequency of the corresponding voltage vosc of the LC oscillator. The spectral lines in the spectrum of vosc lie accordingly at $$\omega osc0 - (\omega osc0 - \omega L1,2,3) = \omega L1,2,3 510 \text{ and}$$

$$\omega osc0 + (\omega osc0 - \omega L1,2,3) = 2 \cdot \omega osc0 - \omega L1,2,3 511.$$

Figure 6:
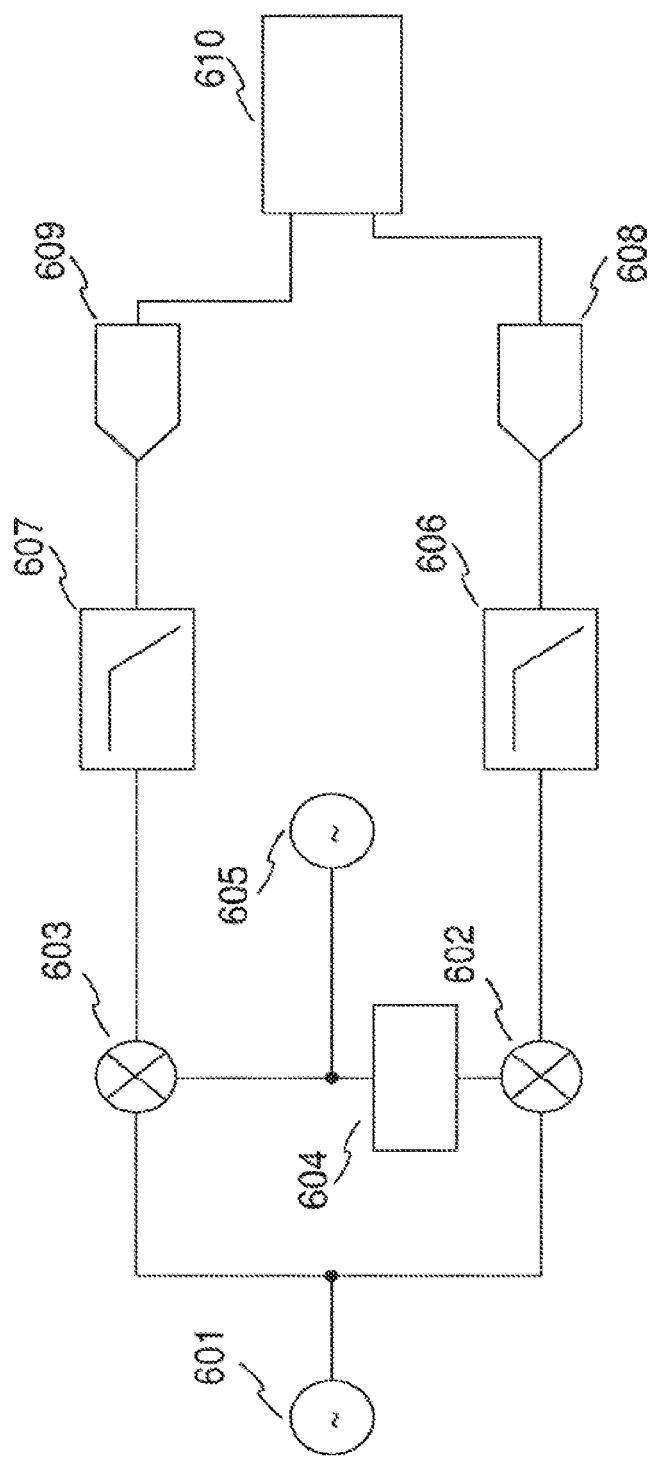
FIG. 6 depicts the design of a down frequency converter, which is connected downstream of the LC-VCO.

Depending on the sample magnetization to be detected, the experimental conditions and the free oscillation frequency ωosc0 following the excitation of the sample, the spectral components of the oscillation of the voltage of the LC oscillator can lie at frequencies that can make direct demodulation difficult or inefficient. In addition, the spectral components from the change of the inductance ΔLsample can lie at frequencies that generate modulated frequencies of the free oscillator frequency, which lie less than an octave away from the free oscillation frequency and thus require a "single cycle demodulation", i.e. a demodulation within one vibration of the carrier period of the oscillation of the voltage, in order to receive the information about the magnetization of the sample. The single cycle demodulation can be carried out in a simplified manner digitally if the spectral part of the oscillation of the voltage that is of interest is digitized. Due to the limited bandwidth and the limited resolution capacity of existing analog-to-digital converters, the demodulation therefore potentially requires a prior reduction in the central frequency of the oscillation of the voltage from the possibly raised values for ωosc1 to lower frequencies. This can be achieved e.g. by frequency dividers or frequency mixers. In order to ensure that no information is lost when doing this, a down converter comprising quadrature paths for processing the output voltage of the LC oscillator 601 is connected downstream of the latter, as shown in FIG. 6 and corresponding to one embodiment. The down converter comprising quadrature paths is constructed from I and Q path mixers 602/603, which are operated at a suitable frequency ωVCO2 of a reference oscillator 605, from which a quadrature version, e.g. with a 90° phase modifier 604, can be generated. The reduced and filtered oscillation frequency of the voltage can then be digitized using customary analog-to-digital converters 608/609 for a device 610 for further processing in digital representation. Before the analog-to-digital conversion, the bandwidth is limited by so-called anti-aliasing filters 606/607, due to which artifacts based on the alias effect are filtered out.

Figure 7:
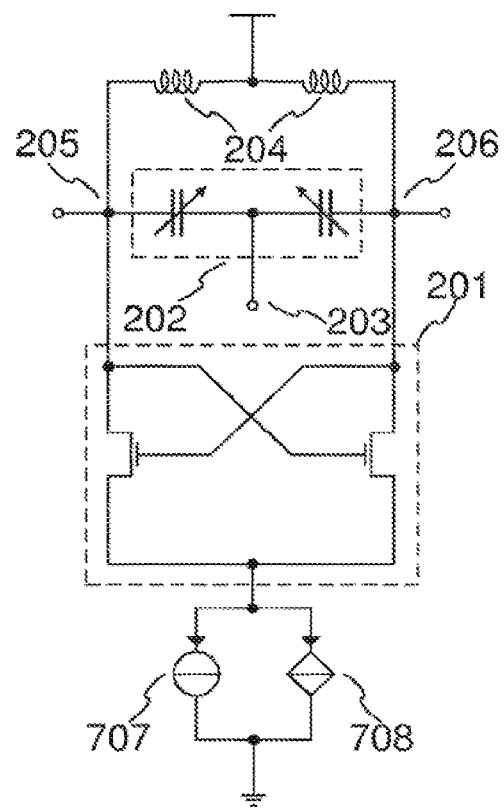
FIG. 7 depicts the design of an LC-VCO for use in a device for generating and detecting a transient magnetization, expanded by a voltage-controlled current source.

FIG. 7 shows two examples of an embodiment for implementing precise control of the oscillation amplitude of the coil of the LC oscillator, which has a voltage-controlled current source 708 parallel to a fixed bias current 707. In this execution the time-dependent waveform, which is used to manipulate the amplitude of the oscillation of the LC oscillator, is fed into the voltage-controlled current source in order to optimize an envelope of the transient magnetic field, which is generated in the coil of the LC oscillator, in line with the requirements of the sample and the experiment.

Figure 8:
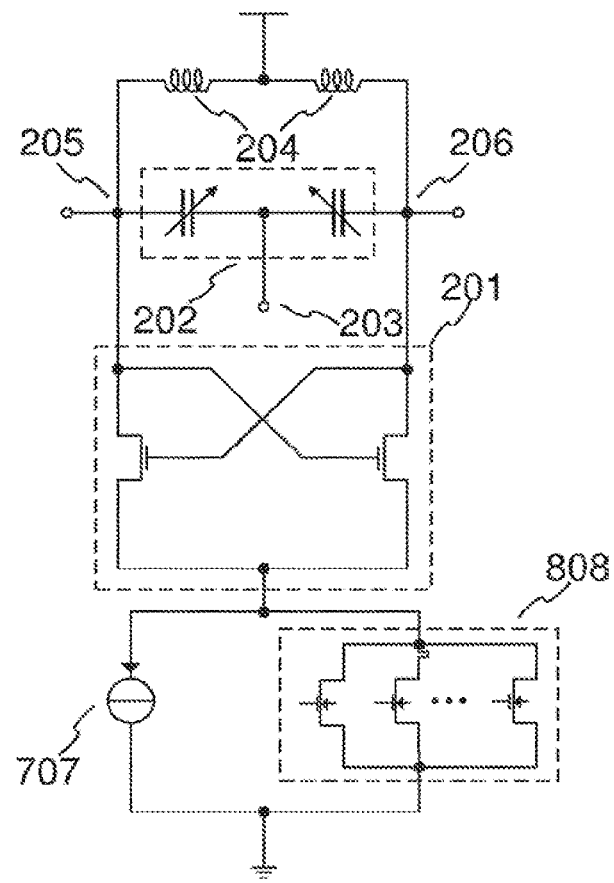
FIG. 8 depicts the design of an LC-VCO for use in a device for generating and detecting a transient magnetization, expanded by a voltage-controlled current source, which is designed as a digital current controller.

FIG. 8 shows how the voltage-controlled current source 708 in FIG. 7 can be implemented efficiently as a high-speed current mode digital-to-analog-converter 808.

In order to illustrate the working principle of a device according to an embodiment of the invention and a method according to an embodiment of the invention for generating and detecting a transient magnetization of a sample, simulations of a magnetization of a sample and associated signals are shown in FIGS. 9 to 13. The simulations are based on the new model of transient inductance and transient resistance of a coil described at the beginning, which model is used to determine the original spectral lines of a sample, the signals deriving from an experiment using a sample according to an embodiment of the invention or from a method according to an embodiment of the invention. The magnetization of the sample is based in this case on two different spin ensembles, with two different associated g factors. The simulations are calculated both for a period during the application of a transient magnetic field (excitation) and for a period following the excitation. The parameters are assumed here as follows: g factor of the first spin ensemble g1=2, g factor of the second spin ensemble g2=2.025, equilibrium magnetization (Ms0) of the first spin ensemble Ms0g1=7.3 A/m, equilibrium magnetization of the second spin ensemble Ms0g2=8.1 A/m, relaxation times for both spin ensembles T1=T2=10 μs, static magnetic field B0=0.35 T, free oscillation frequency ωosc0=21.74 GHz and oscillation frequency during excitation ωosc2=9.56 GHz.

Figure 9A:
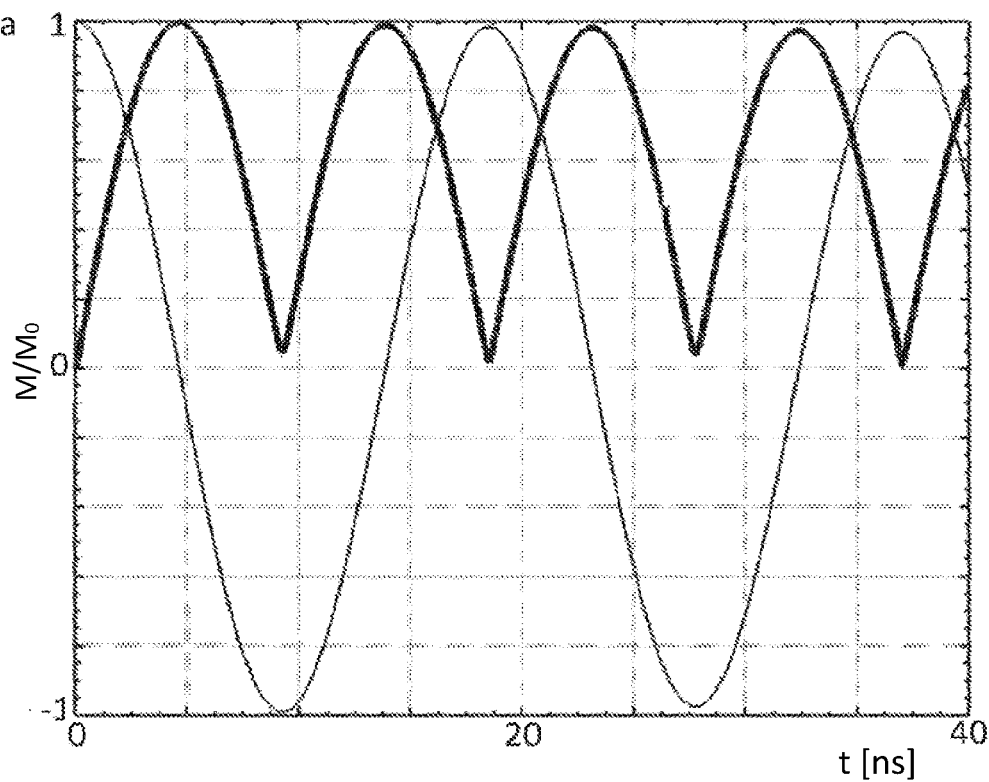
FIG. 9a) illustrates a simulation of the z-component and the envelope of the transverse magnetization of a magnetization of a sample based on electron spin in a coil of a voltage-controlled LC-VCO during a transient magnetic field with resonance frequency.
Figure 9B:
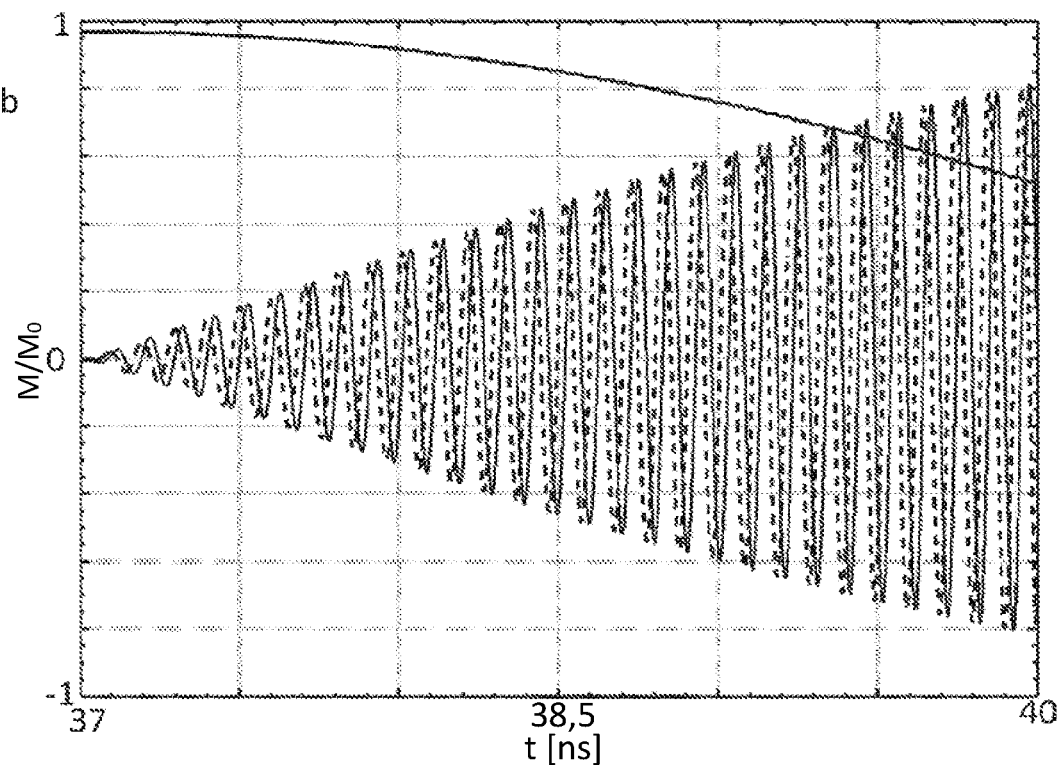
FIG. 9b) illustrates a simulation of the x-, y- and z-components during the last three nanoseconds of the transient magnetic field.

FIG. 9 a) shows the evolution of the longitudinal magnetization Mz (—) and that of the envelope |MT| (—) of the transverse components (Mx and My) of a sample during the period in which a time-dependent waveform in the form of a rectangular pulse (40 ns), as shown in FIG. 3, is fed into the LC oscillator according to an embodiment of the invention and the sample is arranged at the sample location (simulation). Here the rectangular pulse is selected so that the free oscillation frequency of the coil of the LC oscillator, which frequency is present in the coil before the rectangular pulse, lies sufficiently far from the resonance frequency of the sample so as not to influence the magnetization of the latter. Furthermore, the frequency during the rectangular pulse corresponds to the resonance frequency of the sample or is approximately as great, in order to influence the magnetization of the sample. The duration of the excitation (duration of the rectangular pulse) is selected here so that a plurality of Rabi oscillations can be observed, so that the final vector of the magnetization of the sample corresponds to a transverse magnetization, which is detected. In FIG. 9b), the behavior of the components Mz ( . . . ), My (- -) and Mz (—) during the last three seconds of the excitation are shown.

Figure 10:
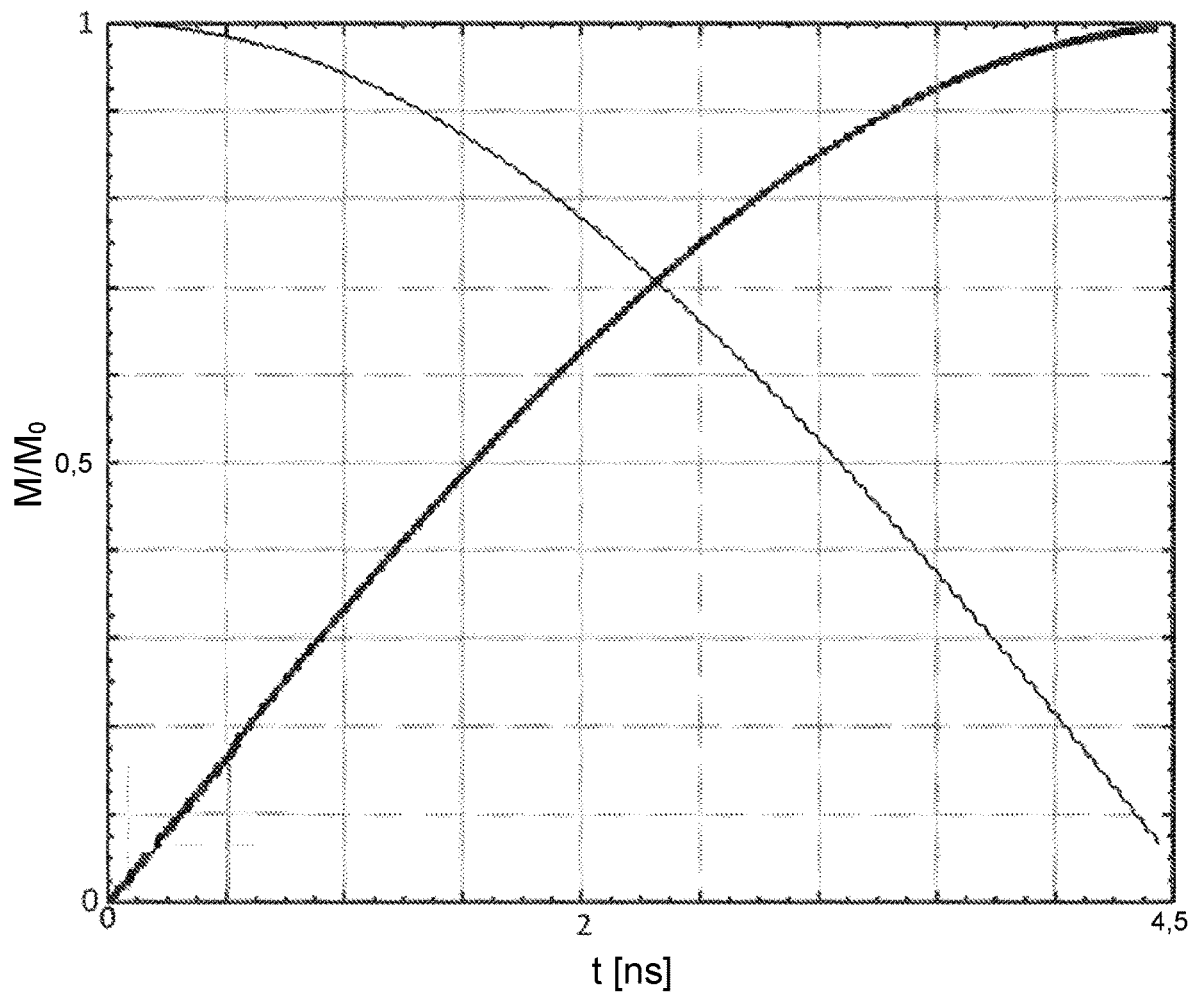
FIG. 10 illustrates a simulation of the course of the magnetization Mz and the amount of the envelope of the transverse magnetization |MT| for a pulse with the duration $\tau=4.436$ ns (approx. 90° pulse)

The simulation of the curve of the magnetization Mz (—) and the amount of the envelope of the transverse magnetization |MT| (—) for a pulse with the duration τ=4.436 ns (approx. 90° pulse) is shown in FIG. 10.

Figure 11:
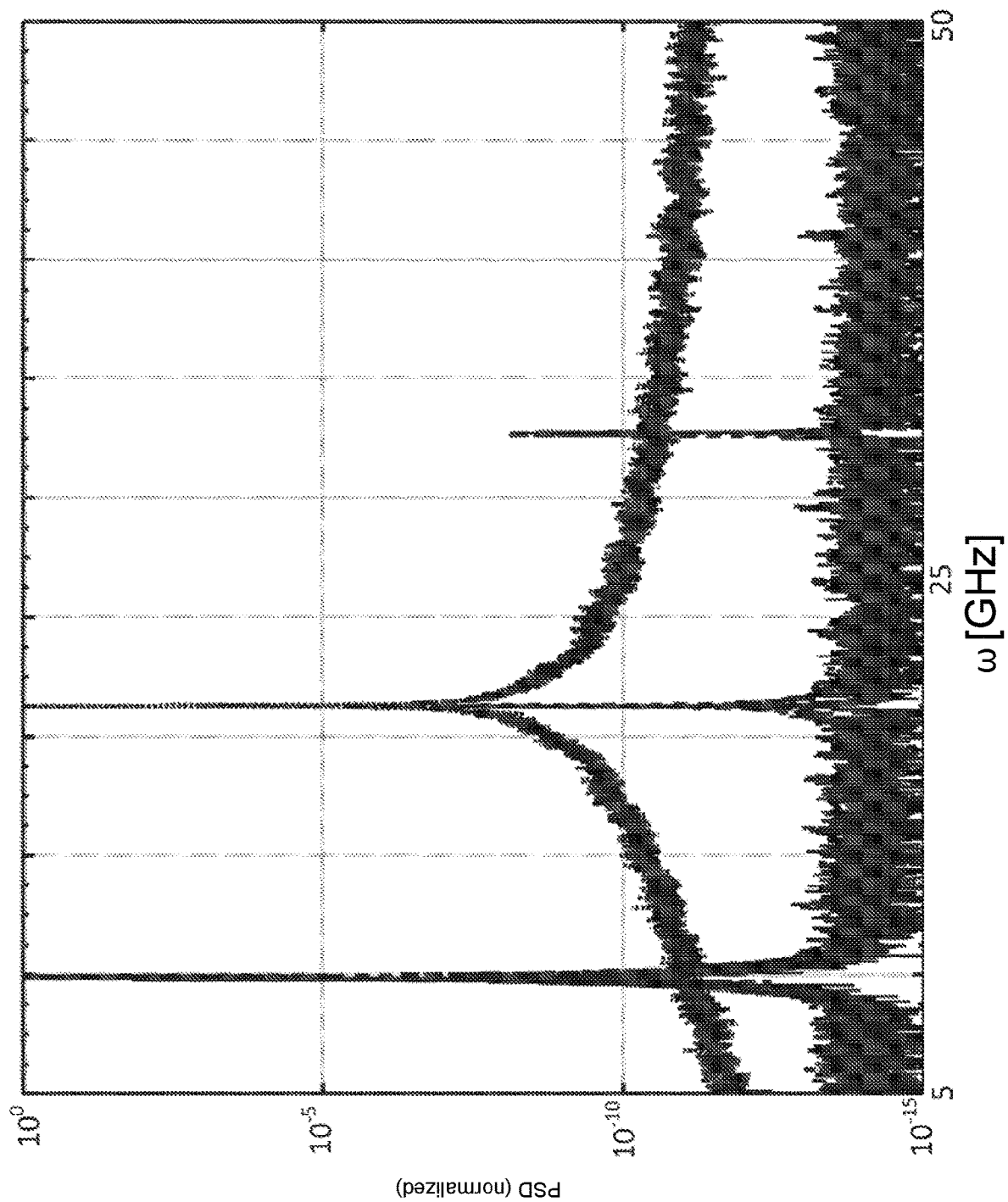
FIG. 11 illustrates a simulation of the spectral power density of the oscillator output voltage following a pulse of the duration $\tau=4.436$ ns.

The simulated spectrum, associated with FIG. 10, of the power spectral density (PSD) of the oscillator output voltage following a pulse of the duration τ=4.436 ns is shown in FIG. 11.

Figure 12:
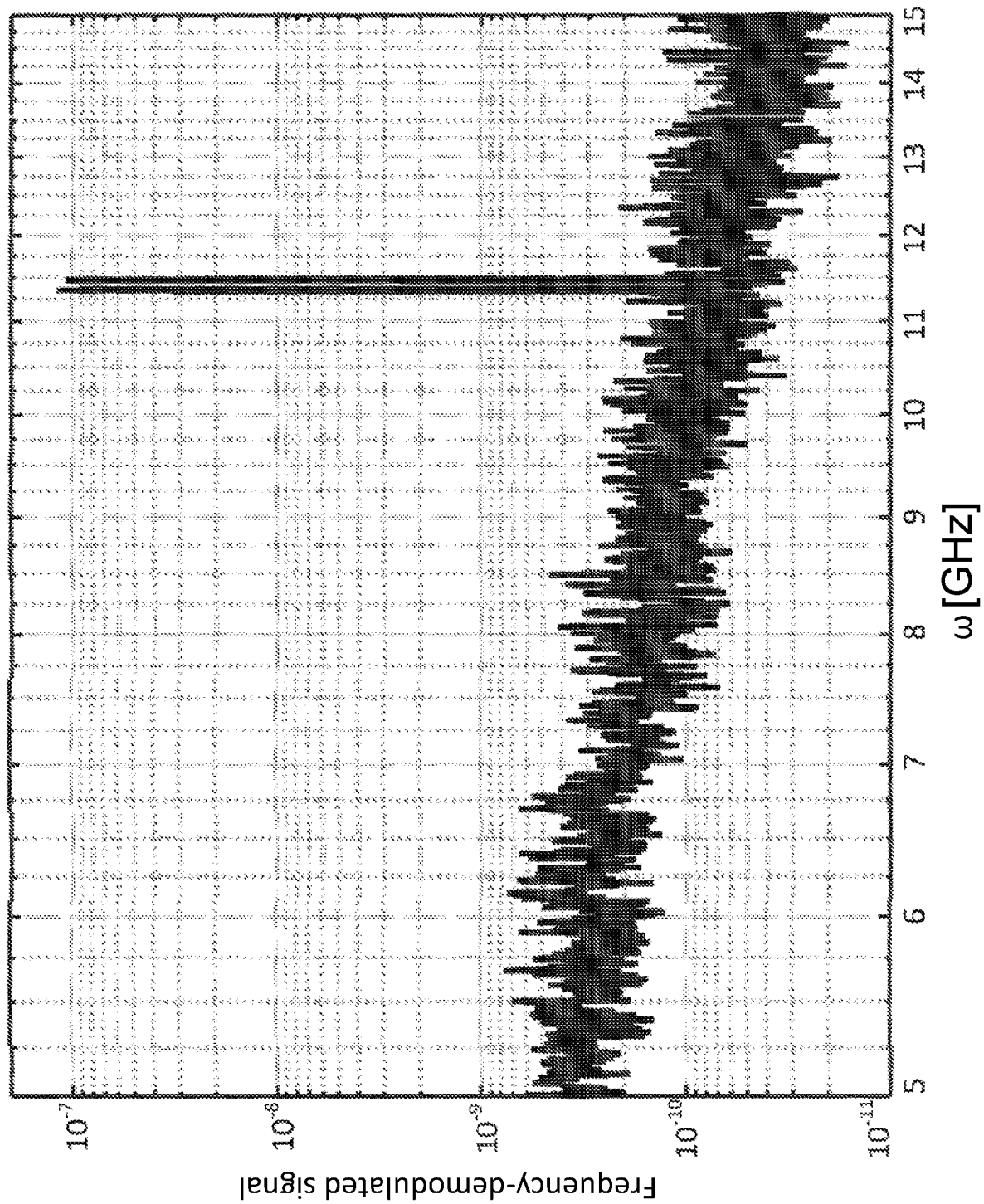
FIG. 12 illustrates a spectrum of FIG. 11 following digital frequency demodulation and low-pass filtering (simulation)
Figure 13:
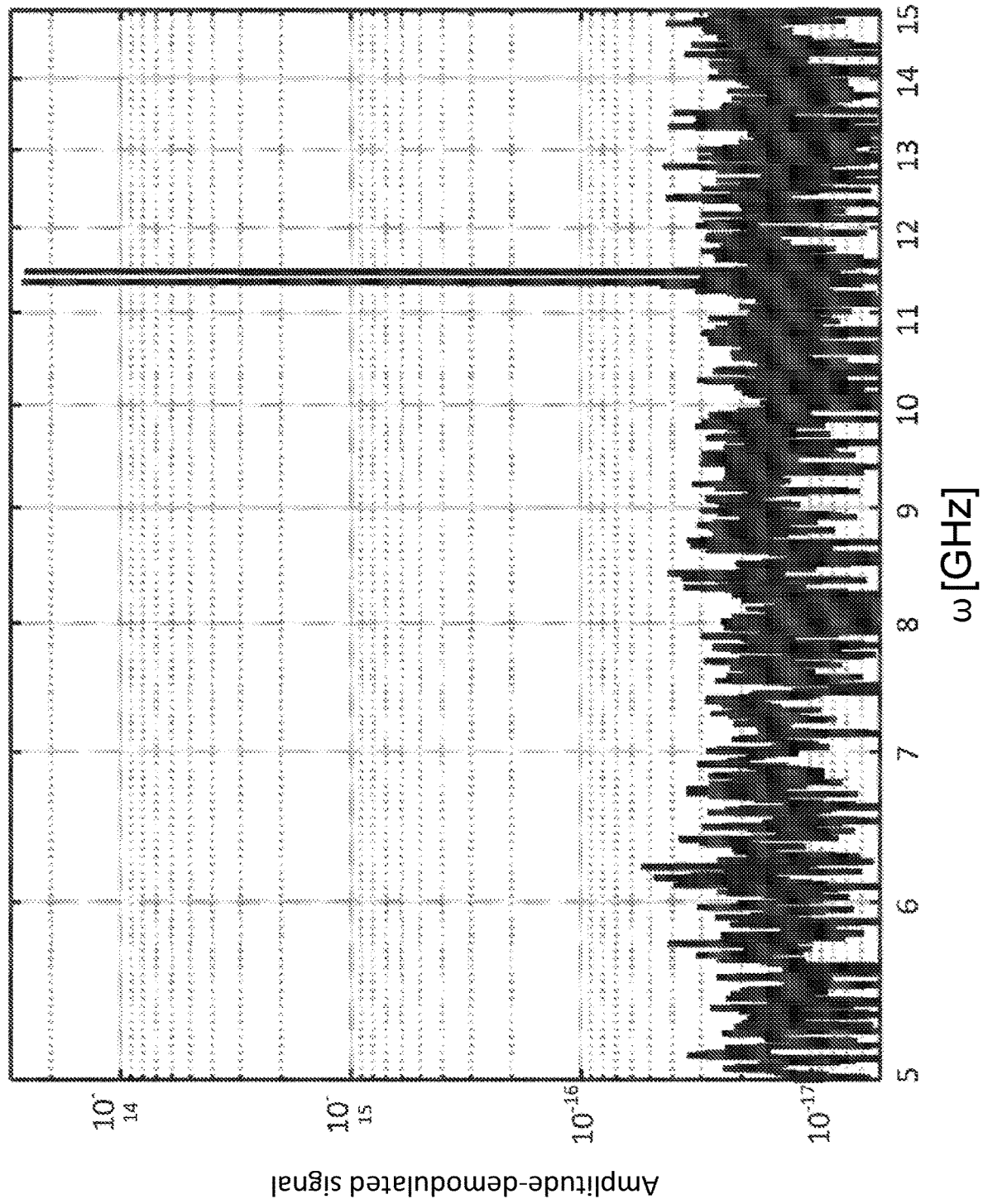
FIG. 13 illustrates a spectrum of FIG. 11 following amplitude demodulation (simulation)

FIG. 12 and FIG. 13 show the corresponding FM- and AM-demodulated signals, which follow from FIG. 11.

The frequencies following pulse excitation and demodulation corresponding to FIGS. 12 and 13, which can be read out as signals (and are forwarded for data processing) and are based on a free oscillation frequency of $$\frac{\omega_{osc0}}{2\pi} = 21.76 \text{ GHz}$$

and the g factors of the sample g1=2 and g2=2.025, from which the Larmor frequencies at $$\frac{\omega_{L1}}{2\pi} = 9.7974 \text{ GHz and } \frac{\omega_{L1}}{2\pi} = 9.9198 \text{ GHz}$$

result, correspond exactly to the spectral components (excitation with the arithmetic mean of the two Larmor frequencies) following demodulation $$\frac{\omega_{osc0} - \omega_{L1}}{2\pi} = 11.4786 \text{ GHz and } \frac{\omega_{osc0} - \omega_{L2}}{2\pi} = 11.3562 \text{ GHz}.$$

Figure 14A:
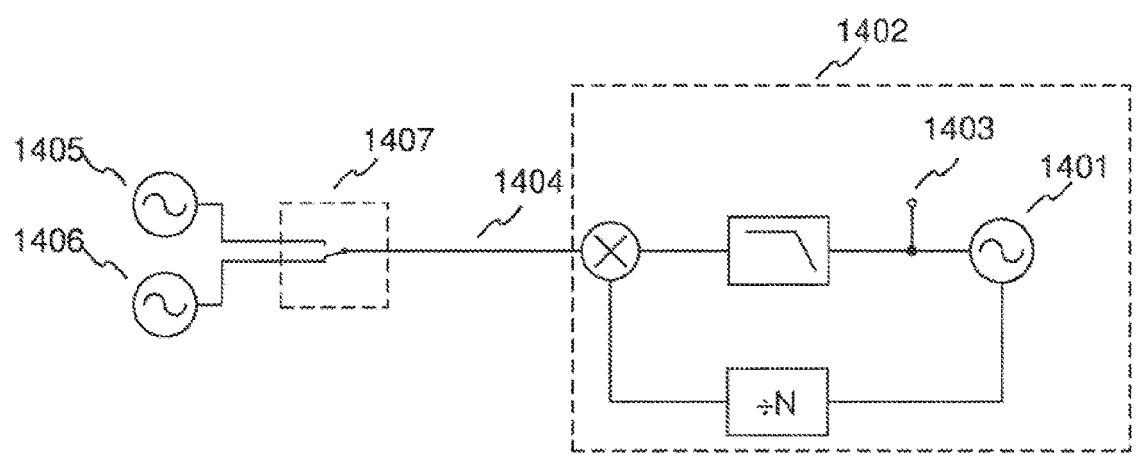
FIG. 14a) illustrates an LC-VCO integrated in a phase-locked loop comprising two reference oscillators.
Figure 14B:
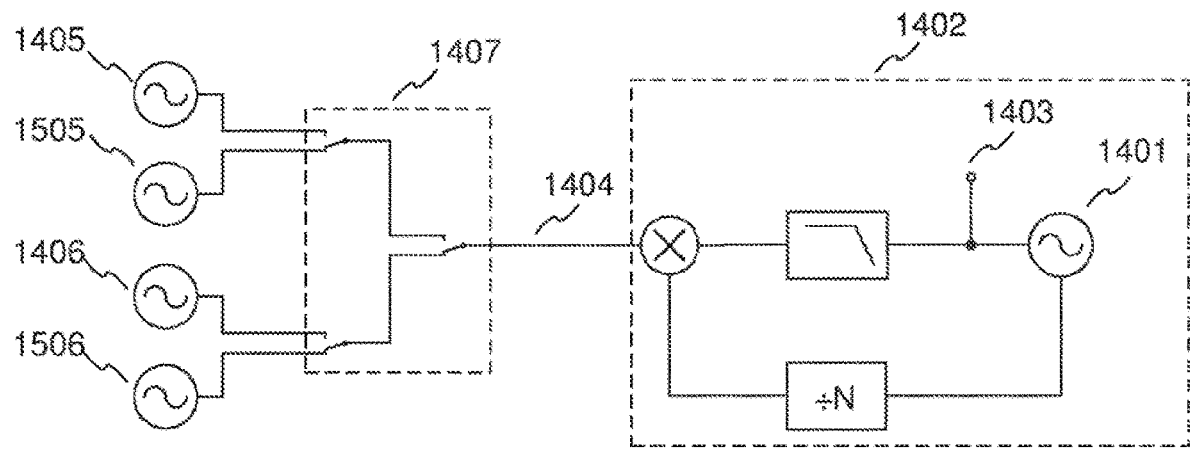
FIG. 14b) illustrates an LC-VCO integrated in a phase-locked loop comprising four reference oscillators.

An LC-VCO 1401 according to an embodiment of the invention, integrated in phase-locked loops 1402, is shown in FIGS. 14 a) and b). The phase-locked loops 1402 guarantee that in a sequence of excitation pulses (transient magnetic fields) in an ESR or NMR experiment, the phase information of successive pulses is not lost between the switching of the LC-VCO 1401, between an excitation frequency close to or equal to the resonance frequency and a frequency remote from this. The phase coherence is guaranteed, in that a reference frequency ωref 1404 can be selected from two different sources (oscillators 1405, 1406) which runs continuously at a frequency ωres/N or ωoff/N, with N=division factor of the phase-locked loop 1402, ωres a frequency close to or equal to the resonance frequency and ωoff a frequency remote from the resonance frequency. The choice between the two frequencies is made by means of a suitable multiplexer 1407. If the reference frequency 1404 of the phase-locked loop 1402 is switched between ωoff/N and ωres/N, the frequency of the LC-VCO 1401 in the phase-locked loop 1402 alternates accordingly between $\omega_{off}$ and $\omega_{res}$ due to the negative feedback in the phase-locked loop 1402. Since the oscillators 1405/1406, which are used as sources, run continuously at the same frequencies, i.e. they do not change these, their phase does not change either between two time spans in which their frequency is fed into the LC-VCO, which is significant in particular for the time spans for $\omega_{res}$. Since the phase-locked loop 1402 matches the phase of the VCO 1401 with the phase of the reference oscillator due to its negative feedback structure, it is guaranteed (disregarding short transient responses) that a sequence of excitation pulses is coherent with regard to its phase. In order moreover to guarantee a coherent exchange in sequences of excitation pulses and different pulse sequences (phase cycling), the circuit according to FIG. 14*a*) can be expanded to that of FIG. 14*b*). In the expanded circuit, two additional sources 1505/1506 for reference frequencies are added, which run at a 90° phase difference to the sources from FIG. 14*a*). An excitation in the x' and y' direction of the rotating coordinate system (rotating frame of reference) is thus enabled. The circuit can also be expanded to enable excitations in other directions by adding other sources for reference frequencies with corresponding phase differences. Outputs 1403, at which frequency-demodulated signals can be tapped directly, are provided in addition.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF ABBREVIATIONS $A_{osc}$ Oscillation amplitude of an LC oscillator
B Magnetic field
$B_0$ Statically homogeneous, statically inhomogeneous or dynamic (pulsed inhomogeneous) magnetic field
$B_1$ Additional, high-frequency, electromagnetic alternating field/magnetic field; used for excitation, can be present as a transient field temporally limited in one property
$\vec{B}_u$ Unitary magnetic field
C Capacitance
$\vec{e}_\parallel$ Unit vector in the direction of the $B_0$ field
$E_1$ Electrical field
$G_m$ Transconductance of the active transistor, which causes the negative resistance, which is used to stabilize the oscillation
$G_r$ Conductance of resonant circuit
h Planck's constant
$H_1$ Magnetic field strength
i(t) Current flow associated with v(t)
$I_{BIAS}$ DC quiescent current of the oscillator (bias current)
J Current density
$\vec{L}$ Orbital angular momentum
$L_0$ Sample-independent expression of the inductance of the coil, produced by its geometry
$L_{eff}$ Effective inductance
L(t) Temporally variable inductance, linked to the magnetic field in a coil
$\Delta L_{sample}(t)$ Detectable change in the inductance of the sample in the transient magnetic field
$\Delta L_{sample,cw}(t)$ Detectable change in the inductance of the sample in the continuous wave experiment
$\vec{M}$ Macroscopic magnetization, magnetization of the sample
$M_S$ Spin-based magnetization
$M_{s\parallel}$ Longitudinal spin-based magnetization in relation to $B_0$
$M_\perp$ Transverse spin-based magnetization in relation to $B_0$
$M_{S0}$ State of equilibrium of spin-based magnetization
$M_x$ Magnetization of a spin ensemble
n Emission factor in the sub-threshold range
p Power
r Distance vector from origin for an integration via the volume
$R_0$ Ohmic coil resistance
$R_{eff}$ Effective resistance of the coil
$R_{sample,tot}$ Coil resistance induced by the sample
$R_{sample}(t)$ Temporally variable loss in the coil caused by the magnetization of the sample
t Time
$T_1$ Relaxation time
$T_2$ Spin-spin relaxation time
v(t) Voltage loss over a coil
V Volume
$V_S$ Sample volume
$w_m$ Energy density per unit of volume
$W_m$ Total magnetic energy linked to the inductance coil
γ Gyromagnetic ratio
$\varepsilon_0$ Electric field constant
η Fill factor
θ Tilt angle of the magnetization
$\vec{\mu}$ Magnetic dipole moment
$\mu_B$ Bohr magneton
$\mu_r$ Relative permeability of the sample
$\mu_0$ Magnetic field constant
$\vec{\tau}$ Torque
$\tau_{puls}$ Duration of application of resonant $B_1$ field (transient field, excitation field, pulse)
ω Angular frequency
$\omega_{osc}$ Frequency of oscillator
$\omega_{osc0}$ Free frequency of oscillator=frequency of magnetic field strength $H_1$
$\omega_{oscx}$ Frequency of oscillator under the influence of sample magnetization
$\omega_L$ Larmor frequency
$\omega_{LC}$ Resonance frequency of resonant circuit
$\omega_i$ Frequency of spectral components of sample magnetization
$\chi_m$ Susceptibility CMOS Complementary metal-oxide-semiconductor
ESR Electron spin resonance spectroscopy
NMR Nuclear magnetic resonance spectroscopy
VCO Voltage Controlled Oscillator

The invention claimed is:

1. A device for generating and detecting a transient magnetization of a sample, the device comprising:
   a static magnetic field generator configured to generate a static magnetic field of predetermined direction and strength at a sample location,
   a transmission device for providing a transient magnetic field at the sample location;
   a receiving device for detecting a transient magnetization of the sample at the sample location; and
   an output configured to output spectral output components of the magnetization of the sample,
   wherein an LC oscillator forms both the transmission device and the receiving device,
   wherein an oscillation frequency of the LC oscillator depends on a value of an inductive element of the LC oscillator,
   wherein a controller is configured to control the LC oscillator, wherein the controller is configured to generate first and second time dependent waveforms, wherein a transient magnetic field generated by the LC oscillator is capable of deflecting a magnetization of a sample out of equilibrium, wherein the period of the transient magnetic field can be restricted to the sub-nanosecond range, and wherein the sample location lies in the near field of the LC oscillator,
   wherein at least one modulator, analog-to-digital converters, and digital data processors are connected downstream of the LC oscillator for processing an output voltage, and
   wherein a processor configured to determine the spectral components of the magnetization of the sample based on a physical model of transient inductance and transient resistance of a coil by at least the frequency or amplitude of the output voltage of the LC oscillator is provided in the digital data processors.

2. The device according to claim 1, wherein the at least one modulator is a frequency demodulator and the processor configured to determine spectral components of the magnetization of the sample based on the physical model of transient inductance and transient resistance of a coil comprises the term:

$$\Delta L_{sample}(t) \equiv \int_{V_s}\left[-\vec{B}_1(\vec{r}) \cdot \frac{\vec{M}(t, \vec{r})}{i^2(t)}\right] dV$$

with $\Delta L_{sample}$=detectable inductance of the sample in the transient magnetic field, $V_s$=sample volume, $\vec{B}_1$=excitation magnetic field, $\vec{r}$=distance vector from origin for the integration via the volume, $\vec{M}$=magnetization of the sample, $i(t)$=current flow belonging to voltage loss over a coil, and $t$=time.

3. The device according to claim 1, wherein the at least one modulator is an amplitude demodulator and the processor configured to determine spectral components of the magnetization of the sample based on the physical model of transient inductance and transient resistance of a coil comprises the term:

$$A_{osc} = A_{osc}\Big|_{R_{eff}=R_0} + \frac{\partial A_{osc}}{\partial R_{eff}}\Big|_{R_{eff}=R_0} \cdot R_{sample,tot}$$

with $A_{osc}$=oscillation amplitude of the LC oscillator, $R_{eff}$=effective resistance of the coil, $R_0$=ohmic coil resistance and $R_{sample,tot}$=resistance of the coil induced by the sample.

4. The device according to claim 1, wherein the at least one modulator comprises a frequency demodulator and an amplitude demodulator and the processor configured to determine spectral components of the magnetization of the sample based on the physical model of transient inductance and transient resistance of a coil comprises the terms:

$$\Delta L_{sample}(t) \equiv \int_{V_s}\left[-\vec{B}_1(\vec{r}) \cdot \frac{\vec{M}(t, \vec{r})}{i^2(t)}\right] dV \text{ and}$$

$$A_{osc} = A_{osc}\Big|_{R_{eff}=R_0} + \frac{\partial A_{osc}}{\partial R_{eff}}\Big|_{R_{eff}=R_0} \cdot R_{sample,tot}.$$

5. The device according to claim 1, wherein the controller configured to control the LC oscillator is a data processing system, which generates a first time-dependent waveform as control voltage for the LC oscillator and a second time-dependent waveform for adjusting the envelope of the transient magnetization of the LC oscillator, digital-to-analog converters being connected upstream of the LC oscillator.

6. The device according to claim 5, wherein the digital-to-analog converter for the second time-dependent waveform is integrated into a current source of the LC oscillator.

7. The device according to claim 1, wherein the LC oscillator is an LC-VCO.

8. The device according to claim 7, wherein a circuit arrangement of the LC-VCO has at least one differential capacitance diode and a differential inductor for forming an LC resonant circuit, two cross-coupled transistors, an input for the control voltage, a second input for the supply voltage, a grounding, and two nodal points at which output voltages can be tapped.

9. The device according to claim 8, wherein the LC-VCO is expanded by a voltage-controlled current source.

10. The device according to claim 9, wherein the voltage-controlled current source is designed as a digital current controller.

11. The device according to claim 7, wherein the LC-VCO is integrated in a phase-locked loop having two reference oscillators.

12. The device according to claim 1, wherein a down converter comprising quadrature paths for processing the output voltage of the LC oscillator is connected downstream of this.

13. A method for generating and detecting a transient magnetization of a sample, the method comprising:
   a. arranging the sample at a sample location;
   b. providing a static magnetic field of a predetermined direction and strength at the sample location;
   c. generating a transient magnetic field by an LC oscillator, an oscillation frequency of the LC oscillator depending on a value of an inductive element of the LC oscillator, wherein the sample location lies in a near field of the LC oscillator, a transient magnetic field is sufficient to deflect a magnetization of the sample out of equilibrium, and a period of the transient magnetic field can be limited to a sub-nanosecond range;

d. tapping an output voltage of the LC oscillator before, during, and subsequent to the transient magnetic field, e. demodulating time-dependent changes in a frequency and an amplitude of the output voltage, digitizing the output voltage in a predetermined order, and transmitting to a digital data processor, f. inputting detected frequencies or amplitudes into a physical model of transient inductance and transient resistance of a coil, wherein, from a frequency of the oscillator output voltage with $$\Delta L_{sample}(t) \equiv \int_{V_s} \left[ -\vec{B}_1(\vec{r}) \cdot \frac{\vec{M}(t,\vec{r})}{i^2(t)} \right] dV$$

with $\Delta L_{sample}(t)$=detectable inductance of the sample in the transient magnetic field, $V_s$=sample volume, $\vec{B}_1$=excitation magnetic field, $\vec{r}$=distance vector from the origin for the integration via the volume, $\vec{M}$=magnetization of the sample, i(t)=current flow belonging to the voltage loss over a coil and t=time, spectral components of the sample are determined, or wherein, from an amplitude of the oscillator output voltage $A_{osc}$ $$A_{osc} = A_{osc}\Big|_{R_{eff}=R_0} + \frac{\partial A_{osc}}{\partial R_{eff}}\Big|_{R_{eff}=R_0} \cdot R_{sample,tot}$$

with $R_{eff}$=effective resistance of the coil, $R_0$=ohmic coil resistance and $R_{sample,tot}$=resistance of the coil induced by the sample, spectral components of a sample are determined; and g. outputting the spectral components for further processing.

14. A device for generating and detecting a transient magnetization of a sample, the device comprising:

a static magnetic field generator configured to generate a static magnetic field of predetermined direction and strength at a sample location, a transmitter configured to provide a transient magnetic field at the sample location; and a receiver configured to detect a transient magnetization of the sample at the sample location; and an output configured to output spectral output components of the magnetization of the sample, wherein an LC oscillator forms both the transmitter and the receiver, wherein an oscillation frequency of the LC oscillator depends on a value of an inductive element of the LC oscillator, wherein a controller is configured to control the LC oscillator, wherein a transient magnetic field generated by the LC oscillator and the controller is capable of deflecting a magnetization of a sample out of equilibrium, wherein the period of the transient magnetic field can be restricted to the sub-nanosecond range, and wherein the sample location lies in the near field of the LC oscillator, wherein at least one modulator, analog-to-digital converters, and digital data processors are connected downstream of the LC oscillator and configured to process an output voltage, wherein a processor configured to determine spectral components of the magnetization of the sample based on a physical model of transient inductance and transient resistance of a coil by at least the frequency or amplitude of the output voltage of the LC oscillator is provided in the digital data processors, wherein the at least one modulator is a frequency demodulator and the processor configured to determine spectral components of the magnetization of the sample based on the physical model of transient inductance and transient resistance of a coil comprises the term:

$$\Delta L_{sample}(t) \equiv \int_{V_s} \left[ -\vec{B}_1(\vec{r}) \cdot \frac{\vec{M}(t,\vec{r})}{i^2(t)} \right] dV$$

with $\Delta L_{sample}(t)$=detectable inductance of the sample in the transient magnetic field, $V_s$=sample volume, $\vec{B}_1$=excitation magnetic field, $\vec{r}$=distance vector from origin for the integration via the volume, $\vec{M}$=magnetization of the sample, i(t)=current flow belonging to voltage loss over a coil, and t=time.

* * * * *